(12) United States Patent
De Jongh

(10) Patent No.: US 10,033,353 B2
(45) Date of Patent: Jul. 24, 2018

(54) SWITCHABLE CAPACITOR ARRAY AND METHOD FOR DRIVING A SWITCHABLE CAPACITOR ARRAY

(71) Applicant: QUALCOMM Technologies, Inc., San Diego, CA (US)

(72) Inventor: Maurice De Jongh, Nijmegen (NL)

(73) Assignee: QUALCOMM Technologies, Inc., San Diego, CA (US)

( * ) Notice: Subject to any disclaimer, the term of this patent is extended or adjusted under 35 U.S.C. 154(b) by 221 days.

(21) Appl. No.: 14/893,581

(22) PCT Filed: Jun. 19, 2013

(86) PCT No.: PCT/EP2013/062803
§ 371 (c)(1),
(2) Date: Nov. 24, 2015

(87) PCT Pub. No.: WO2014/202137
PCT Pub. Date: Dec. 24, 2014

(65) Prior Publication Data
US 2016/0126934 A1    May 5, 2016

(51) Int. Cl.
| | | |
|---|---|---|
| *H03H 11/04* | (2006.01) | |
| *H03H 11/28* | (2006.01) | |
| *H03J 5/24* | (2006.01) | |
| *H03J 1/00* | (2006.01) | |
| *H03H 7/01* | (2006.01) | |

(52) U.S. Cl.
CPC ............ *H03J 5/244* (2013.01); *H03H 11/04* (2013.01); *H03H 11/28* (2013.01); *H03J 1/0008* (2013.01); *H03J 5/246* (2013.01); *H03J 2200/10* (2013.01)

(58) Field of Classification Search
CPC ................................ H03H 11/04; H03H 11/28
See application file for complete search history.

(56) References Cited

U.S. PATENT DOCUMENTS

| | | | |
|---|---|---|---|
| 4,890,180 A | 12/1989 | Paulsson | |
| 7,937,058 B2 * | 5/2011 | Rahman | H03H 11/1291 455/296 |

(Continued)

FOREIGN PATENT DOCUMENTS

DE    102009033673    2/2011

OTHER PUBLICATIONS

Durham A.M, et al., "Circuit Architectures for High Linearity Monolithic Continuous-Time Filtering", IEEE Transactions on Circuits and Systems II: Express Briefs, IEEE Service Center, New York, NY, US, vol. 39, No. 9, Sep. 1, 1992 (Sep. 1, 1992), pp. 651-657, XP000360386, ISSN: 1057-7130, DOI: DOI:10.1109/82. 193320.

(Continued)

*Primary Examiner* — Dean Takaoka
*Assistant Examiner* — Alan Wong
(74) *Attorney, Agent, or Firm* — Smith Tempel Blaha LLC/Qualcomm

(57) ABSTRACT

An improved switchable capacitor array comprises a plurality of n≥2 capacitor units, each comprising a capacitor with a capacitance and a switch unit. The capacitor units are electrically connected in series. Equidistantly spaced impedance values can be obtained if the values of the capacitances are chosen properly.

18 Claims, 16 Drawing Sheets

(56) References Cited

U.S. PATENT DOCUMENTS

| | | | |
|---|---|---|---|
| 8,405,467 B2* | 3/2013 | He | H03H 7/40 |
| | | | 333/17.3 |
| 8,680,947 B1* | 3/2014 | Costa | H01P 1/213 |
| | | | 333/101 |
| 8,952,748 B2* | 2/2015 | Guimaraes | H01L 28/40 |
| | | | 327/554 |
| 9,197,194 B2* | 11/2015 | Reedy | H03M 1/1061 |
| 2009/0134949 A1* | 5/2009 | He | H03H 7/40 |
| | | | 333/17.3 |
| 2011/0260774 A1 | 10/2011 | Granger-Jones et al. | |
| 2013/0314175 A1* | 11/2013 | Morris, III | H03J 5/0209 |
| | | | 333/174 |

OTHER PUBLICATIONS

International Search Report and Written Opinion—PCT/EP2013/062803—ISA/EPO—dated Feb. 25, 2014.

Thomas A., et al., "A MIM-Cap free digitally tunable NMOS Pi-Network", Microwave and RF Conference, 2013 IEEE MTT-S International, Dec. 14-16, 2013, pp. 1-4.

\* cited by examiner

SWITCHABLE CAPACITOR ARRAY AND METHOD FOR DRIVING A SWITCHABLE CAPACITOR ARRAY

The present invention relates to the field of switchable capacitor arrays, e.g. arrays that may be used as variable capacitance elements in impedance tuners of RF devices, and to methods for driving such arrays.

Wireless communication devices, e.g. mobile phones and similar devices, can comprise antennas which are susceptible to detuning due to changes in the antennas' environment. An impedance matching circuit can help to reestablish a tuned TX or RX condition of the communication device. Such impedance matching circuits usually comprise variable impedance elements, e.g. variable capacitance elements, connected in a signal path and controlled by a logic circuit.

From WO2009/108391, conventional switchable capacitor arrays with a plurality of capacitors connected in parallel are known.

From WO2011/113749, adjustable capacitance elements with equidistant impedance steps are known.

From US 2011/0260774 biasing schemes are known.

What is needed is a switchable capacitor array which allows further miniaturization without a loss in signal quality.

It is therefore an object of the present invention to provide such a switchable capacitor array and a method for driving a switchable capacitor array.

The independent claims provide such a switchable capacitor array and such a method, respectively. Dependent claims provide preferred embodiments.

A switchable capacitor array comprises a plurality of $n \geq 2$ capacitor units. Each capacitor unit comprises a capacitor with a capacitance $c_i$ and a switch unit. The capacitor units are electrically connected in series. The switch unit of each capacitor unit is electrically connected in parallel to the respective capacitor of the capacitor unit.

In the following, capital letters (C) are used for total capacities of whole capacitor arrays. Lower case letters ($c_i$) are used for the capacitance of individual capacitors.

The central idea of the present switchable capacitor arrays is to electrically connect the single capacitors in series while conventional switchable capacitor arrays have the capacitors connected in parallel. While the total capacity of a parallel connection of two or more capacitors is the sum of the single capacities of the individual capacitors, the behavior of a series connection of capacitors is more complex. The inverse total capacitance $C_{tot}$ of a series connection of capacitors with a capacitance $c_x$ and $c_y$ is the sum of the inverse individual capacitances. This yields:

$$C_{tot}(c_x, c_y) = \frac{c_x c_y}{c_x + c_y} \quad (1)$$

To obtain the total capacitance of a plurality of serially connected capacitors, equation 1 has to be applied recursively.

It was—despite the complex behavior of serially connected capacitors—found that such a serial connection allows to cover an area in the impedance domain (Z domain) much more homogenously compared to parallel connected capacitors. The impedance Z of a capacitor with a capacitance c is $$Z(c) = -j \frac{1}{2\pi f c} \quad (2)$$

Thus, the impedance and the capacitance are reciprocal. Conventional switchable capacitor arrays with parallel connected capacitors that provide equidistant steps in the capacitance domain cannot provide equidistant steps in the impedance domain. However, it was found that a series connection of capacitors can provide equidistant steps in the impedance domain if the capacitances $c_i$ of the single capacitors are chosen properly.

In parallel connected capacitor arrays, many impedance states are densely packed in one section of the impedance range while other sections are only rarely covered. Equidistant steps in the impedance domain provide a homogenously covered impedance domain and, thus, good tuning abilities over a wide frequency range as the impedance is also frequency dependent.

The advantage of equidistant steps in the impedance domain is that a smaller number of individual capacitors is needed to provide a good tuning ability even in communication devices working in the low band and in the high band. It is, thus, possible to reduce a chip's size by a factor of 0.7 reducing manufacturing costs also. In addition, the requirements on the switch technology, e.g. with respect to the switch off-voltage handling, the off-capacitance value and the off-capacitance Q-factor, are reduced. Therefore, the RF signal quality is increased. In particular, improvements with respect to non-linearity, insertion loss and capacitance spread are obtained.

When the switchable capacitor array is electrically connected in a signal path of a mobile communication device, an RF signal can either propagate via the capacitor or via the switch depending on whether the switch connected parallel to the capacitor is open or closed. Thus, each capacitor can be coupled individually to the signal path or can be separated from the signal path.

When n capacitor units are present, a total number of $2^n$ individual capacitance values and therefore impedance values can be obtained.

In one embodiment, the capacitor values have a binary weighting.

This means that the capacitance of the next larger capacitor is doubled:

$$c_{i+1} = \frac{c_i}{2} \quad (i = 0 \ldots n-1) \quad (3)$$

The numbering of the individual capacitances can be arbitrary. The capacitances can increase or decrease with increasing index i without loss of generality. It was found that the complex calculation of the total capacitance $C_{tot}$ of a series connection of capacitors according to equation 1 can be simplified if the capacitances $c_i$ of the individual capacitors are binary weighted. Then, the total capacitance is:

$$C_{tot}(b_0, \ldots, b_{n-1}) = \frac{1}{b_0 \frac{1}{c_0} + b_1 \frac{1}{c_1} + \ldots + b_{n-1} \frac{1}{c_{n-1}}} \quad (4a)$$

$$C_{tot}(c_0, b_0, \ldots, b_{n-1}) = \frac{1}{b_0 \frac{2^0}{c_0} + b_1 \frac{2^1}{c_0} + \ldots + b_{n-1} \frac{2^{n-1}}{c_0}} \quad (4b)$$

-continued $$C_{tot}(c_0, b_0, \ldots, b_{n-1}) = \frac{c_0}{b_0 2^0 + b_1 2^1 + \ldots + b_{n-1} 2^{n-1}} \quad (4c)$$

where $c_0$ is the largest capacitance of the individual capacitances and $b_0, \ldots, b_{n-1}$ represent the switching status of the respective switch unit: $b_i=1$ for "the switch is open" and $b_i=0$ for "the switch is closed". Thus, the largest total capacitance $C_{tot}$ is $c_0$ if only switch i=0 is open ($b_0=1$) and the other switches are closed ($b_1 \ldots b_{n-1}=0$) decoupling the respective other capacitors from the signal path. It is to be noted that the switch with the smallest index number i=0 belongs to the largest individual capacitance $c_0$ while the switch with the largest index number i=n−1 belongs to the smallest individual capacitance. However, the numbering of the switches and the numbering of the capacitances can be arbitrary without any loss of generality.

Replacing c in equation 2 by $C_{tot}$ of equation 4 instantly yields equidistantly spaced impedance values in the Z-domain.

It is also to be noted that if all switch units are closed, i.e. if all capacitors are decoupled from the signal path, then the total capacitance becomes infinite and the impedance becomes 0 and the switchable capacitor array forms an ideal through-circuit. Such a through-circuit cannot be obtained with a parallel connection of capacitors that are in series with switches.

In one embodiment, the capacitor values have a binary weighting with an offset.

A binary weighting with an offset is characterized in that the fact that the next larger capacitance is doubled holds true only for a few capacitors. However, it is the case that at least one ratio of adjacent capacitances deviates from the factor 2. Thus, the individual capacitances have the following form:

General equation for factor F:

$$C_{tot}(c_0, b_0, \ldots, b_{n-1}) = \frac{1}{b_0 \frac{2^0}{c_0} + b_1 \frac{2^1}{c_0} + \ldots + b_i \frac{2^i}{c_0} + b_{i+1} \frac{2^{i+1}F}{c_0} \ldots + b_{n-1} \frac{2^{n-1}F}{c_0}} \quad (5a)$$

$$c_0 = \frac{1}{2^0} c_0,\; c_1 = \frac{1}{2^1} c_0,\; c_2 = \frac{1}{2^2} c_0,\; \ldots,\; c_i = \frac{1}{2^i} c_0, \quad (5b)$$

$$c_{i+1} = \frac{1}{2^{i+1}} \frac{1}{F} c_0, \ldots, c_{n-1} = \frac{1}{2^{n-1}} \frac{1}{F} c_0$$

If F<1 then the capacitances are increased. If F=1, binary coding is obtains.

Thus, the ratio between the individual capacitance $c_i$ and $c_{i+1}$ is two times a correction factor F. This ratio is maintained for the respective other capacitances. It is possible that i=1, i.e. i+1=2. Thus, the ratio between the capacitance values of the n−1 smallest capacitances is 2F while the ratio between the largest capacitance and the second largest capacitance is 2. Then, equidistantly spaced impedance values are not obtained any longer. However, multiple sets of equidistantly spaced impedance values are obtained.

In a special case the factor F is only used at the MSB (Most Significant Bit), then two sets of equidistantly spaced impedance values are obtained, and one set could be used in a low-band frequency range and the respective other set could be used in the high-band frequency range.

In one embodiment, the capacitors have the same capacitance values $c_0=c_1 \ldots =c_{n-1}$.

With such an array, a thermometer coding can be utilized to control the switch units. When all capacitors have the same capacity, all capacitors are equivalent and only the number of activated capacitors determines the total capacity $C_{tot}$. Then, a great degree of redundancy can be obtained which may be preferred because a first set of capacitors with the individual capacitance value $c_0$ can be utilized in a high-power environment while the respective other set can be utilized in a low-power environment. The total capacitance $C_{tot}$ of a configuration where m equal capacitors are coupled to the signal path is $C_0/m$.

Of course, a combination of thermometer coding with a first set of capacitors of equal capacitance and a binary weighting with a second sub-set of capacitors in the capacitor array is also possible to obtain a high number of individual capacitance and impedance states, respectively, while having redundancy.

Accordingly, in one embodiment, the array provides $2^n$ switchable capacitance values which have equidistantly spaced reactance values.

In one embodiment, the switch units comprise stacks of switches.

In serially connected capacitors, the voltage over a respective capacitor is proportional to the capacitance of the respective capacitor if a constant current is assumed. A capacitor having a large capacitance sees a smaller voltage and a capacitor having a smaller capacitance sees a higher voltage. Real switches used in the respective switch units may add non-linear contributions to the RF signal propagating in the signal path. The amount of the non-linear contributions may depend on the voltage across the respective switch. Stacks of switches, i.e. cascaded switches—serial connections of individual switches, in the respective switch unit divides the voltage seen by the switch unit and yields a lower voltage at an individual switch and, as a result thereof, lower non-linear contributions.

Especially at a set of capacitors where the capacitance values are binary weighted, the number of individual switches in the respective switch stack can also be binary weighted.

To cover with parasitic capacitances a deviation from binary weighting can be implemented. E.g. a weighting with 1, 2, 4, or 10 individual switches.

In one embodiment, the switch unit comprises switches selected from FET switches (FET=Field Effect Transistor), CMOS switches (CMOS=Complementary Metal Oxide Semiconductor), GaAs switches (GaAs=gallium arsenide), pHEMT switches (pHEMT=p High-Electron Mobility Transistor), SOI switches (SOI=Silicon On Insulator), SOS switches (SOS=Silicon On Sapphire), and MEMS switches.

However, every switch technology is possible. The switches can be semiconductor switches or MEMS switches (MEMS=MicroElectro-Mechanical System).

In one embodiment, the capacitors are MIM capacitors (MIM=Metal Insulator Metal).

Such capacitors can be realized as capacitance elements with an upper metal electrode and a lower metal electrode which are separated by an insulating film. Such capacitors can be realized with thin film technology, e.g. known from semiconductor devices. Then, the capacitors and the respective switches can be realized and arranged on the same substrate and can be created utilizing the same manufacturing steps.

In one embodiment, the array comprises two equal capacitor units. With such capacitor units, a thermometer code or a combination of thermometer code and binary weighting is easy to implement. Further, equal capacitor units have an equal construction and the arrangement, especially with semiconductor switches, on a common carrier substrate is easy to implement.

In one embodiment, the array further comprises an additional capacitor with a capacitance $c_{add}$, electrically connected in parallel to a series connection of the capacitor units.

The additional capacitance $c_{add}$ could be used to counteract parasitic or non linear behavior of other circuit components.

As initially mentioned, the parallel connection of capacitances has as a total capacitance the sum of the respective individual capacitances. Thus, in addition to the total capacitance of the series connection, the capacitance $c_{add}$ can be added to obtain an offset in the capacitance domain and in the impedance domain.

It is possible to provide a further switch to electrically connect or isolate the additional capacitor from the series connection.

In one embodiment, at least one capacitor unit has a parallel connection of capacitors. Dividing the capacitors into parallel connected sub-capacitors allows to have the same total capacitance with a higher degree of freedom of arranging the respective capacitor area on a carrier substrate. Especially when binary weighting is utilized to determine the size of the individual capacitors, a plurality of equally designed basic capacitors can be used and a binary or another weighting can be obtained by implementing the respective number of capacitors within the capacitor unit.

In one embodiment the switch units comprise parallel or serial connected uniform unit cells.

In one embodiment, the switch units are arranged in a first layer system and the capacitors are arranged in a second layer system located above or below the first layer system.

The switches in the switch units and the capacitors can be created using similar thin film deposition and structuring techniques. Accordingly, both functional elements can be arranged on a common carrier substrate. The switches which may be semiconductor switches can be created in one layer system while the capacitors, which may be MIM capacitors, can be created in another layer system before or after creation of the switches.

The capacitance of a capacitor is proportional to the area of the capacitor. A capacitor having a high capacitance needs a large area while a capacitor having a low capacitance needs only a small area. However, a switch unit responsible for switching a capacitor having a low capacitance will see a relatively high voltage while a switch unit responsible for switching a capacitor having a high capacitance will only see low voltage. Thus, when cascades of switches in a switch unit are utilized to reduce the actual voltage of a single switch, a capacitor having a low capacitance can be arranged above or below a switch unit responsible for a capacitor having a high capacitance and vice-versa. Thus, it is possible that for each capacitor, there is a switch unit which may be responsible for switching another capacitor but which may have the need for the same area as the mentioned capacitor. In any case, it is possible that capacitors and switch units have a similar need for area and a provided area on a carrier substrate can be utilized in an optimal way to provide a capacitor array where no area is wasted and where the capacitor array provides an improved linear behavior and improved electric properties.

In one embodiment the array is a tunable capacitor in an RF-filter circuit.

In one embodiment of this array the tunable capacitor is connected in series in a signal path of the RF-filter.

In one embodiment one or all switch units have a bias configuration comprising serial and/or parallel biasing paths with resistive elements adapted to provide a high switch time, a high Q-factor or a preferred trade-off between switch time and Q-factor.

The biasing signal can be fed asymmetrically into the switch unit. Then a good Q-factor but a high switch time is obtained. However, the biasing signal can be fed symmetrically into the switch unit, e.g. via a plurality of parallel biasing paths. Then a a high Q-factor compared to conventional bias schemes can be obtained. However, compared to asymmetric bias schemes the Q-factor is relatively low.

Thus, more degrees of freedom to bias a switch unit compared to US 2011/0260774 are obtained.

Also a mobile communication device comprising an impedance matching circuit with a signal path and an array as described above electrically connected in the signal path is possible as the described switchable capacitor array is well suited as a variable capacitance element.

A method for driving a switchable capacitor array is proposed in which the bits of an n-bit word created with a logic circuit determines the switching state of the n capacitor units of the capacitor array.

The correlation between the bits of the n-bit word and the respective capacitor unit can be arbitrary.

However, in one embodiment, the most significant bit of the n-bit word corresponds to the largest capacitance value while the least significant bit corresponds to the lowest capacitance value. It is also possible that the most significant bit corresponds to the smallest capacitance value and that the least significant bit corresponds to the largest capacitance value.

In a series connection of capacitors, the total capacitance $C_{tot}$ is always smaller or equal to the smallest individual capacitance value. Thus, the smallest capacitance value has the greatest influence on the total capacitance. Thus, a method for driving a switchable capacitor array in which the most significant bit corresponds to the capacitor having the smallest capacitance value provides the most intuitive approach in driving such a capacitor array.

In one embodiment of the method, inverted bits are used to control the switching state of the capacitor units.

As already mentioned above, opening a switch connects the respective capacitor to the signal path while closing the switch separates the capacitor from the signal path as the RF signal propagates via the switch but not via the capacitor. Thus, when bits of the n-bit word are inverted, the value of the bit directly encodes the switching state of the respective switch.

Inverting the bits of the n-bit word corresponds to changing between closed and opened switches. In general, the order of impedance states is reversed by inverting the bits. This can be seen in a graphical view when inverting the bits results in horizontally flipping the switching states.

The concepts and embodiments of the invention are described in the following schematic figures in which FIG. 1 shows a series connection of capacitor units, FIG. 2 shows a series connection of capacitor units connected in parallel to an additional capacitor, FIG. 3A shows a series connection of at least three capacitor units with one capacitor unit comprising two parallel connected capacitors, FIG. 3B shows a series connection of capacitor units with two individually switchable capacitors in one unit, FIG. 3C shows a possible arrangement of switches relative to the capacitors in a capacitor unit, FIG. 3D shows a possible arrangement with one capacitor unit comprising no switch unit, FIG. 4 shows a capacitor unit with an embodiment of a switch unit, FIG. 5 shows a capacitor unit with a plurality of FET elements in the switch unit, FIG. 6 shows a capacitor unit with stacked switches in the switch unit, FIG. 7A shows an arrangement of switches and a biasing possibility in a switch unit, FIG. 7B shows another arrangement of switches and biasing possibility in a switch unit, FIG. 7C shows another arrangement of switches and biasing possibility in a switch unit, FIG. 7D shows another arrangement of switches and biasing possibility in a switch unit, FIG. 7E shows another arrangement of switches and biasing possibility in a switch unit, FIG. 7F shows another arrangement of switches and biasing possibility in a switch unit, FIG. 7G shows a general principle of biasing a switch unit, FIG. 7H shows another general principle of biasing a switch unit, FIG. 7I shows another general principle of biasing a switch unit, FIG. 7J shows another general principle of biasing a switch unit, FIG. 8 shows the possible total capacitances of an n=5 capacitor array, FIG. 9 shows the possible total capacitances of an n=4 capacitor array with inverted bit control, FIG. 10 shows the possible total capacitances of an n=5 capacitor array with inverted bit control, FIG. 11 shows the normalized imaginary part of the impedance values corresponding to the capacitance values shown in FIG. 10, FIG. 12 shows the equal step size in the impedance domain of the capacitor array corresponding to FIGS. 10 and 11, FIG. 13 shows the possible total capacitances of an n=5 capacitor array with binary weighting with an offset, FIG. 14 shows the normalized imaginary part of the impedance values corresponding to the capacitance values shown in FIG. 13, FIG. 15 shows the corresponding impedance step size of the capacitor array corresponding to FIGS. 13 and 14, FIG. 16 shows the possible total capacitances of another n=5 capacitor array with another scaling factor F, FIG. 17 shows the normalized imaginary part of the impedance values corresponding to the capacitance values shown in FIG. 16, FIG. 18 shows the corresponding steps in impedance value corresponding to the capacitor array of FIGS. 16 and 17, FIG. 19 shows the possible total capacitance values of an n=5 capacitor array when a thermometer code is used to control capacitors having the same capacitance values, FIG. 20 shows the normalized imaginary part of the impedance values corresponding to the capacitance values shown in FIG. 19, FIG. 21 shows the corresponding impedance step size of the capacitor array of FIGS. 19 and 20, FIG. 22 shows the possible total capacitances of a capacitor array with thermometer coding for the two most significant bits and a binary weighting with an offset with a factor of 2 for the respective other capacitors, FIG. 23 shows the normalized imaginary part of the impedance values corresponding to the capacitance values shown in FIG. 22, FIG. 24 shows the corresponding impedance steps of an array of FIGS. 22 and 23, FIG. 25 shows the possible total capacitance values for an n=5 capacitor array using thermometer coding and scaling factor, FIG. 26 shows the normalized imaginary part of the impedance values corresponding to the capacitance values shown in FIG. 25, FIG. 27 shows the corresponding values of the impedance steps of the array of FIGS. 25 and 26, FIG. 28 shows the results of a simulation calculating the possible capacitance value of an n=3 switchable capacitor array, FIG. 29 shows the results of the simulation with respect to the corresponding impedance values of the array of FIG. 28, FIG. 30 shows the results of the simulation with respect to the impedance step size of the array of FIGS. 28 and 29, FIG. 31 shows the possible capacitance values of an n=3 capacitor array with binary weighting with offset, FIG. 32 shows the corresponding impedance values of the capacitor array of FIG. 31, FIG. 33 shows the corresponding impedance step size of the array of FIGS. 31 and 32.

FIG. 1 shows a switchable capacitor array SCA comprising a plurality of n capacitor units CU each comprising a capacitor CAP and a switch unit SU. The order of indices do not alter the switching topology or the concepts of the invention. Without loss of generality, indices start as i=0 and end at i=n−1 with a total sum of n capacitor units CU. Especially if only the capacitor having the largest capacitance is activated, the maximum total capacity which may be denoted as $C_0$ is obtained.

The series connection of capacitor units allows to obtain equidistantly spaced impedance values due to the inverse impedance-capacitance relationship and the inventor's finding that serially connected capacitors can provide 1/m capacitance distribution where $0 \leq m \leq 2^n - 1$ is the number counting the different switching states.

FIG. 2 shows an embodiment where an additional capacitor with an additional capacity $CAP_{add}$ is electrically connected in parallel to the cascade of serially connected capacitor units CU. The additional capacitor $CAP_{add}$ allows to have an offset of the respective capacitance values and of the respective impedance values.

FIG. 3A shows a series connection of capacitor units CU wherein at least one capacitor unit and two capacitors CAP1, CAP2 are connected in parallel. The capacitor unit CU comprises two parallel connected switches to shunt the capacitors. It is further possible that a capacitor unit CU comprises a series connection of two individual capacitors as the capacitor unit's capacitor. Such a series connection within a capacitor unit allows to obtain lower voltages applied to the capacitor unit's capacitor and to obtain smaller but precisely defined capacitance values.

FIG. 3B shows a series connection of capacitor units CU with two individually switchable capacitors connected in series in one unit.

FIG. 3C shows an embodiment of a capacitor unit CU with a first capacitor CAP1 connected in parallel to a first switch unit SU1. The capacitor unit CU further comprises a second capacitor CAP2 connected in parallel to the first capacitor CAP1. A second switch unit SU2 is connected in series to the second capacitor CAP2.

FIG. 3D shows a capacitor unit in which the capacitor, e.g. having a capacitance $C_0$, has no switch unit. A switchable capacitor array connected in a shunt branch, i.e. connected to a ground potential, could establish a short circuit if all capacitor units have a switch unit and if all switch units are in a closed state. To prevent the possibility of such a short circuit a capacitor unit without a switch unit can be provided.

FIG. 4 shows an embodiment of a capacitor unit where the switch unit comprises two FET switches. The source of one FET is connected to the drain of the other FET. The source and the drain of each FET is connected via a resistive element R.

The gates of the FET are connected to a control line via a resistive element per gate.

FIG. 5 shows an embodiment where a plurality of FETs is connected in series. Especially the bodies of the FETs are connected to each other via a resistive element $R_B$ per FET. Connecting the bodies of the FETs to each other allows to obtain a improved linearity as different voltages compared to the gate voltage are applied to the FET's body.

FIG. 6 shows an embodiment of a capacitor unit CU where the switch unit comprises stacked switches having two FETs each.

FIG. 7A shows a possible arrangement of cascaded switches in a switch unit where the gate and body connections of the individual switches are biased in a configuration to obtain a high Q-factor of the capacitor unit but also a high switch time. The nodes RF1 and RF2 are connected to the respective electrodes of the capacitance element of the capacitor unit. Thus, via nodes RF1 and RF2 an RF signal can be conducted through the switch unit. In the arrangement of FIG. 7A it is preferred that the orientation is chosen such that the impedance to ground at node RF1 lower then the impedance to ground at node RF2.

E.g. in a shunt switch the RF1 side is grounded (very low impedance to GND), and RF2 is used in the electronic circuit (which has a high impedance to GND, once the switch is off).

It is possible, too, that in the case of a series element an antenna can have any impedance (also very high ohmic compared to 50 Ohm) while the antenna side is then called the high-impedance point and the input side of the circuit (preferably matched to 50 Ohm) is called the lowest impedance point where, in that case, RF2 is connected to.

A control signal to control the individual switches can be applied to the gate connection of the switches via a feeding point $FP_g$. The feeding $FP_g$ is connected via a series connection of resistive elements $R_g$ to the gate connections.

The switches' body can be biased via a further feeding point $FP_b$. The further feeding point $FP_b$ is connected to the bodies of the switches via a series connection of resistive elements $R_b$. After each resistive element $R_b$, the series connection provides a direct connection to the respective body of the respective switch SW.

The drain and the source connections of each individual switch SW are connected via a respective further resistive element $R_d$.

It is possible that the switch unit is in a shunt arrangement. Then, node RF1 is connected to a ground potential. If the switchable capacitor array is connected in an antenna tuner between points a and b, the lowest loss circuit is obtained once RF1 is connected to the node (a or b) with the lowest impedance to ground. This, in the tuner, is at the input side when a tuned state is obtained.

In the "off-state" of the switch unit, the off capacictance has the highest Q-factor at node RF2.

FIG. 7B shows another possible arrangement of cascaded switches in a switch unit. The switches' body can be biased via a feeding point $FP_b$ that is connected via a series connection of resistive elements to the respective switches' body. However, in contrast to the arrangement of FIG. 7A, the first resistive element of the series connection of resistive elements has a resistance value $R_{bc}$ ($R_{bc}$ and $R_{gc}$ are called R-body-common and R-gate-common) being different from the resistance values $R_b$ of the series connection.

A control voltage to the gate connections of the switches SW can be applied via a feeding point $FP_g$. However, in contrast to the arrangement shown in FIG. 7A, the control signal is not applied at the beginning of the series connection of resistive elements $R_g$ but it is applied via a resistive element $R_{gc}$ directly to a switch not being the first switch of the cascaded switches. Neighboring gate connections of neighboring switches SW are connected via a respective resistive element $R_g$.

Such an arrangement provides a high Q-factor at a medium switch time.

It may be preferred that node RF1 is connected to the lowest impedance point to ground of the respective circuit. It is possible that the lowest amount of electrical charge needs to be applied to the switches' bodies. Then, it is preferred that the switches' bodies are connected to a low impedance, too.

A higher amount of electrical charge may be conducted to the gate connections. Therefore, the feeding point $FP_g$ is shifted towards the second node RF2. A tradeoff between switch time and Q-factor is obtained and a trend towards a better switching time or towards a higher Q-factor can be selected depending on the place where the gate control signal is applied to the series connection of resistive elements $R_g$.

A minimum switching time will be obtained when the control signal via the feeding point $FP_g$ is applied in the middle of the cascade.

FIG. 7C shows another possible arrangement of cascaded switches where a control signal to the gate connections of the switches via a feeding point $FP_g$ and a resistive element $R_{gc2}$ can be applied distributed via resistive elements $R_{gc1}$ to the series connection of resistive elements comprising resistive elements $R_{g1}$ and $R_{g2}$ being directly connected to the gate connections of the switches.

In such an arrangement, it is possible that node RF1 is connected to the lowest impedance point of the circuit. The lowest amount of charge that needs to be driven is the charge applied to the body connections.

Thus, a higher amount of charge needs to be driven to the gate connections. By the possibility of applying the gate control signal via distributed (parallel) resistive elements $R_{gc1}$, $R_{gc2}$, a low switching time can be obtained.

FIG. 7D shows an arrangement of cascaded switches. The drain and source and gate and body connections of the switches have a connection similar to the arrangement shown in FIG. 7C. However, the number of switches arranged in the cascade is not restricted. E.g. the number of switches can be between two and 32. It is especially possible to omit the resistive element denoted as $R_{g2}$ in FIG. 7C while the resistive elements $R_{gc1}$ and $R_{gc2}$ have a value equal to half of the resistance of $R_g$: $R_{gc1}=R_{gc2}=0.5\ R_g$.

FIG. 7E shows a possible arrangement of cascades switches in a switch unit where, in contrast to the arrangement shown in FIG. 7D, the control signal to the gate connections of the switches is applied via a resistive element $R_{gc3}$ and a parallel connection comprising the resistive elements $R_{gc1}$ and $R_{gc2}$ directly to the second and second last switch of the cascade. Of course, the resistive elements $R_{gc1}$ and $R_{gc2}$ can be connected at an arbitrary point to the respective gate connection of the cascade of switches. Then, a compromise between an "off-state" Q-factor and switch time can be chosen.

FIG. 7F shows another possible arrangement of cascaded switches in a switch unit where, in order to improve switch time, the control signal to the gate connections of the switches is distributed via three resistive elements $R_{gc1}$, $R_{gc2}$, $R_{gc3}$ and via $R_{gc4}$.

FIGS. 7G to 7J show general concepts of distributing a control signal via a feeding point FP to blocks of switches SW of the switch unit. The control signal can be inserted into the switch unit at the beginning of the cascade and conducted internally as shown in FIG. 7G. Each unit drawn in the figures can consist of an arbitrary number n of switches.

In order to decrease switching time, the control signal can be applied at the center of the cascade and distributed towards the outer switches (FIG. 7H) or conducted to the respective outer blocks of switches and internally distributed to the inner switches (FIG. 7I).

However, each block of switches can obtain a direct control signal via a control signal network as shown in FIG. 7J.

FIG. 8 shows the possible total capacities $C_{tot}$ of an n=5 capacitor array with binary weighting and a largest individual capacitance of 16 pF. The values lie on an y=16/m curve. The fact that the capacitance values show a proportional to 1/m behavior allows to obtain equidistantly spaced impedance values according to equation 2.

The individual total capacitances can be seen in the following table:

| switch state | capacitor value (pF) |
|---|---|
| 0/"00000" | inf |
| 1/"00001" | 16.0 |
| 2/"00010" | 8.0 |
| 3 | 5.3333 |
| 4/"00100" | 4.0 |
| 5 | 3.2 |
| 6 | 2.6667 |
| 7 | 2.2857 |
| 8/"01000" | 2.0 |
| 9 | 1.7778 |
| 10 | 1.6 |
| 11 | 1.4545 |
| 12 | 1.3333 |
| 13 | 1.2308 |
| 14 | 1.1429 |
| 15 | 1.0667 |
| 16/"10000" | 1.0 |
| 17 | 0.94118 |
| 18 | 0.88889 |
| 19 | 0.84211 |
| 20 | 0.8 |
| 21 | 0.7619 |
| 22 | 0.72727 |
| 23 | 0.69565 |
| 24 | 0.66667 |
| 25 | 0.64 |
| 26 | 0.61538 |
| 27 | 0.59259 |
| 28 | 0.57143 |
| 29 | 0.55172 |
| 30 | 0.53333 |
| 31/"11111" | 0.51613 | where the digital numbers in the respective left column represent the switching states m of the switching circuits. If all switches are closed (00000), then no capacitor is connected in the signal path and the total capacitance is infinite resulting in an impedance of 0Ω when using ideal switches.

FIG. 9 shows the possible total capacitance values of a capacitor circuit with n=4 capacitor units. Compared to the array referred to in FIG. 8, the capacitance value increases with increasing index number m as a result of inverting the switching state, i.e. replacing 0 with 1 and 1 with 0.

The index m, thus, is chosen to obtain an ascending or descending capacitance value.

Figure 1:
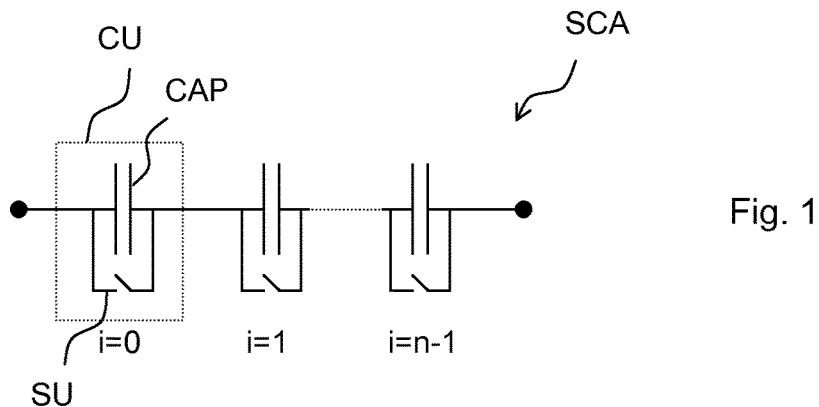
Figure 2:
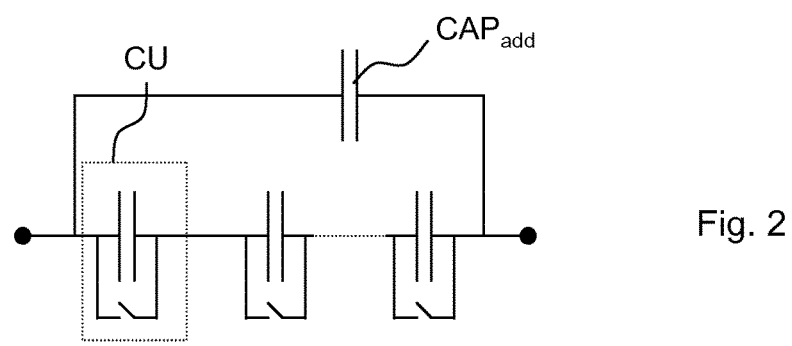
Figure 3A:
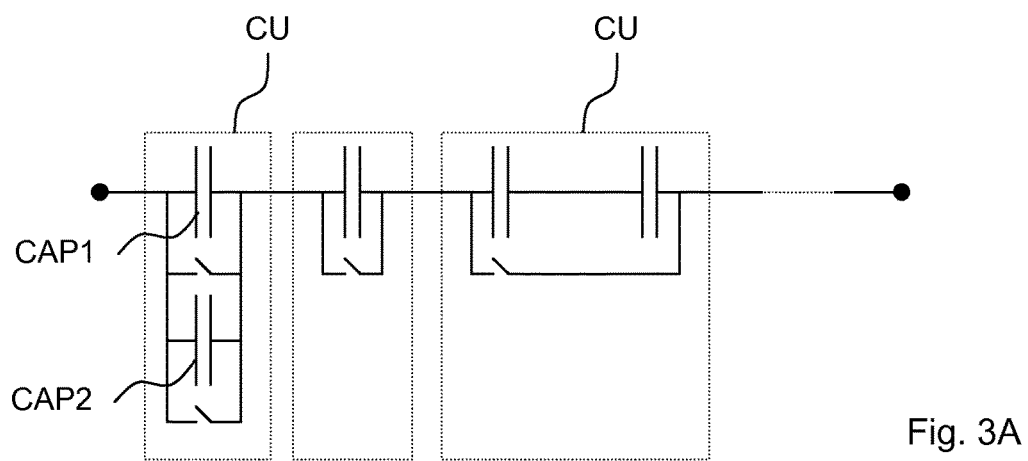
Figure 3B:
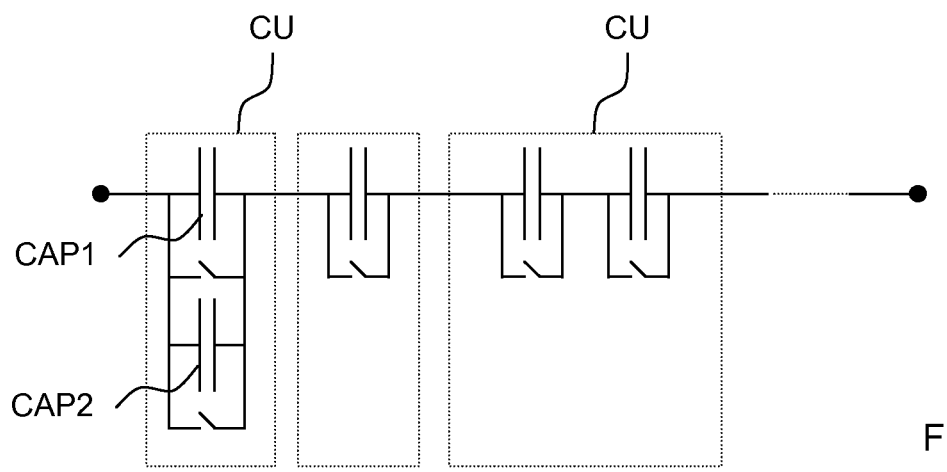
Figure 3C:
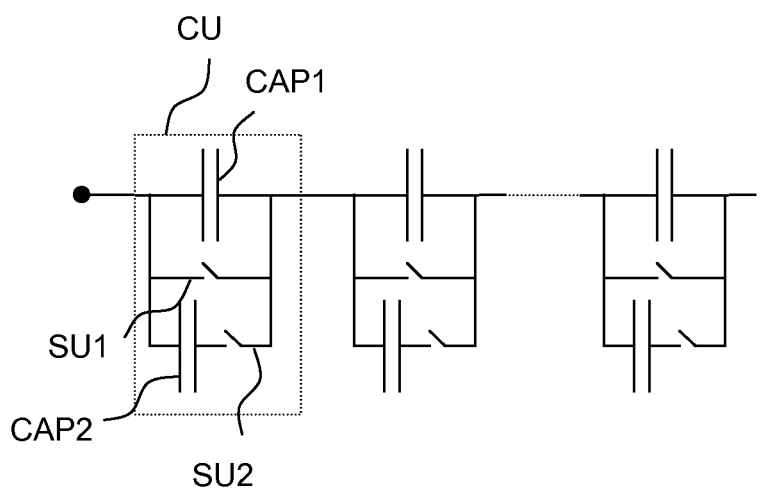
Figure 3D:
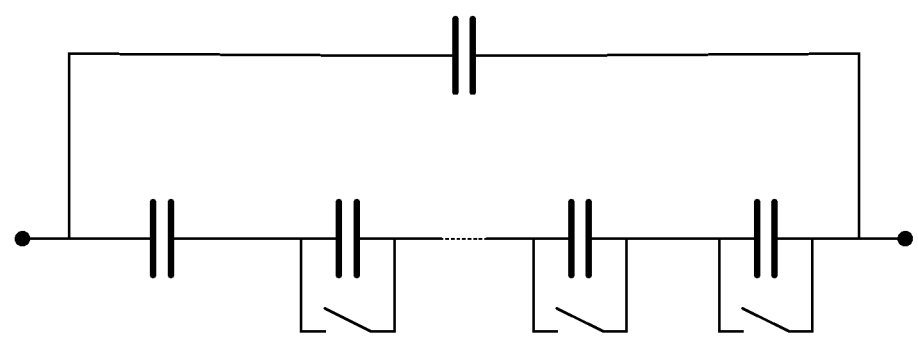
Figure 4:
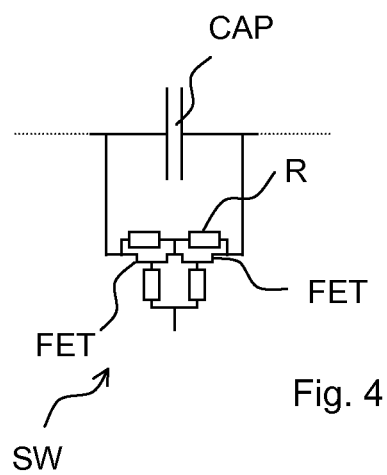
Figure 5:
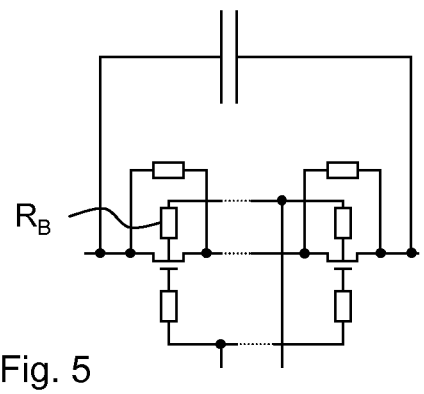
Figure 6:
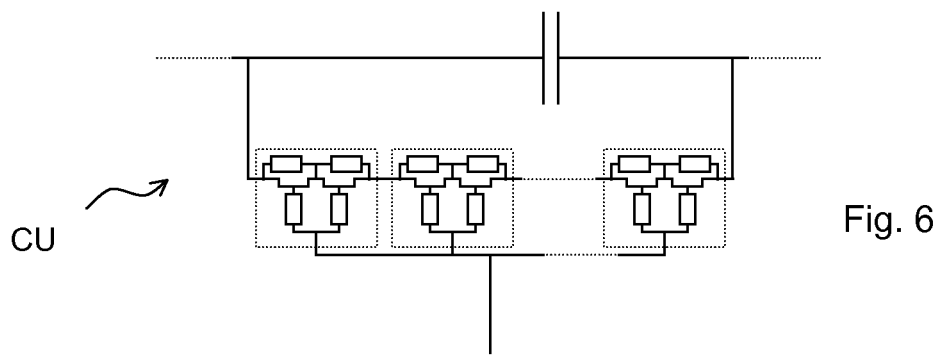
Figure 7A:
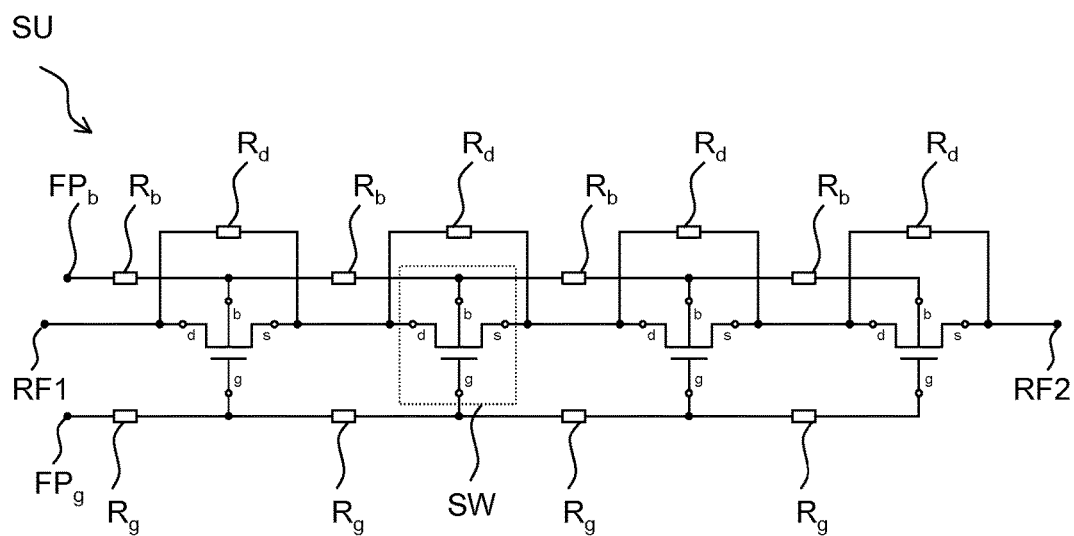
Figure 7B:
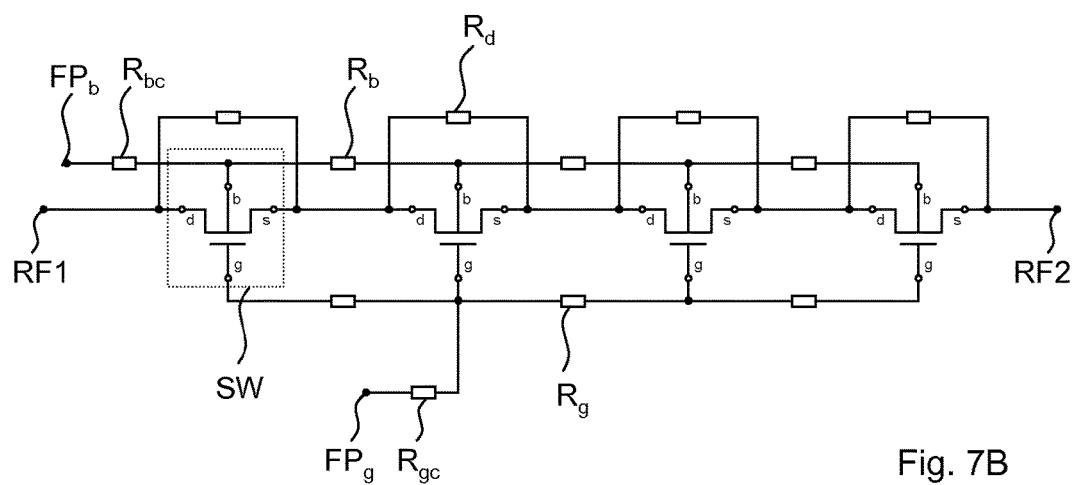
Figure 7C:
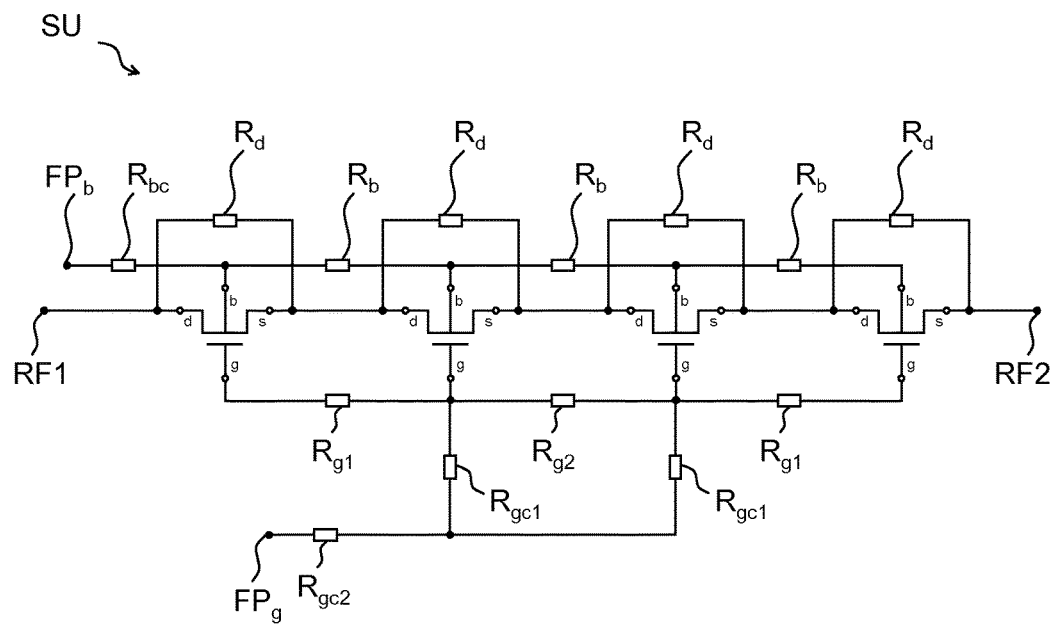
Figure 7D:
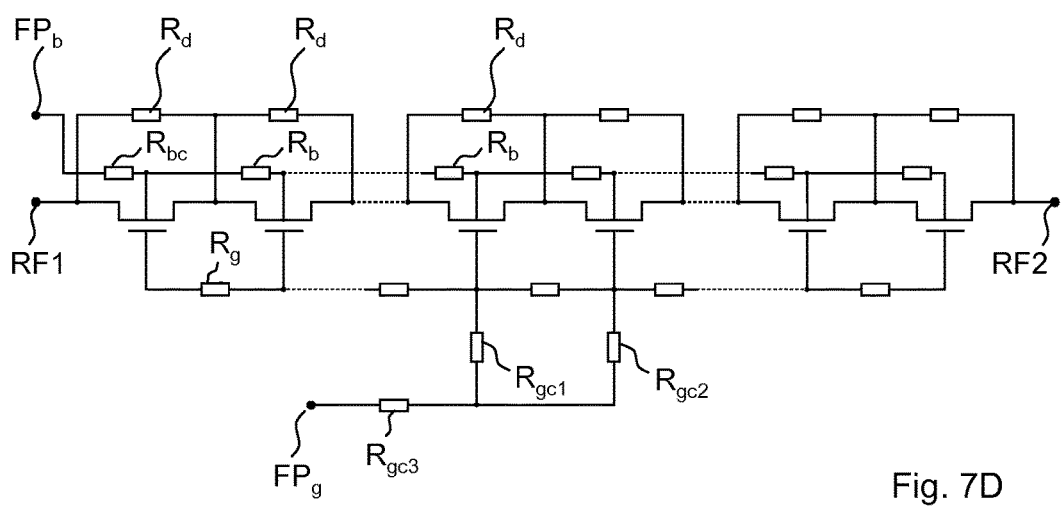
Figure 7E:
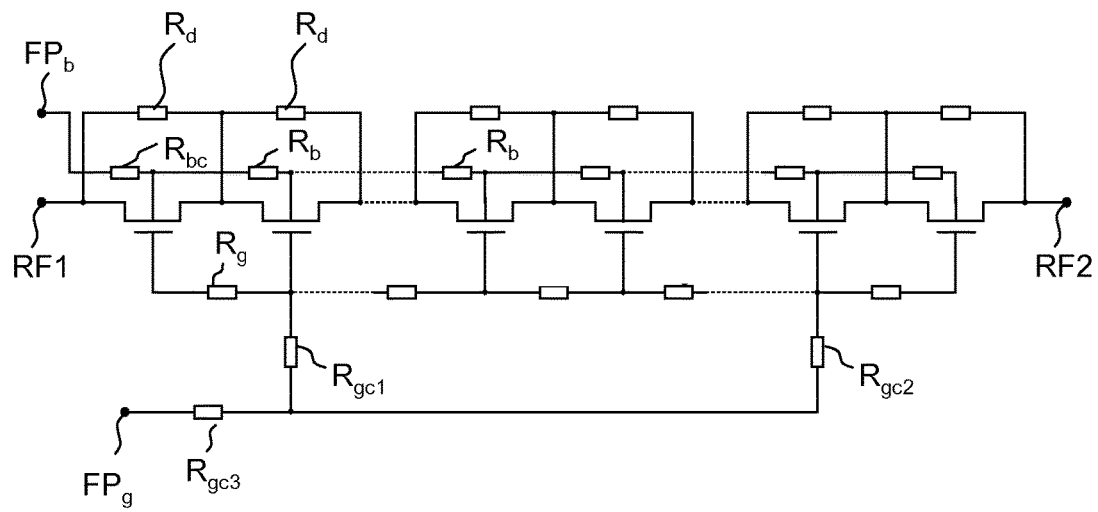
Figure 7F:
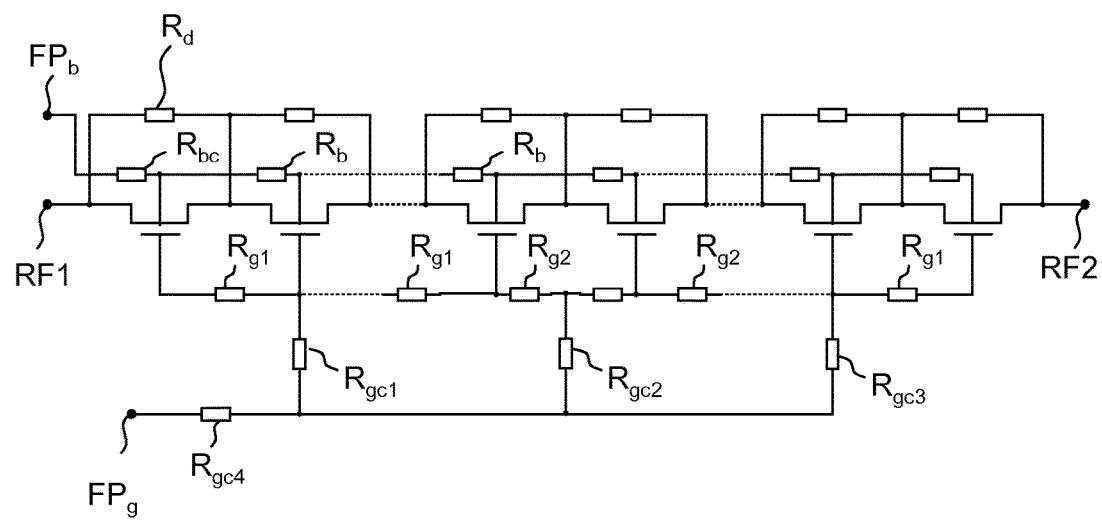
Figure 7G:
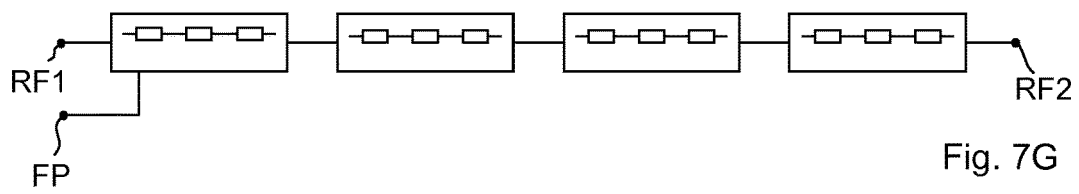
Figure 7H:
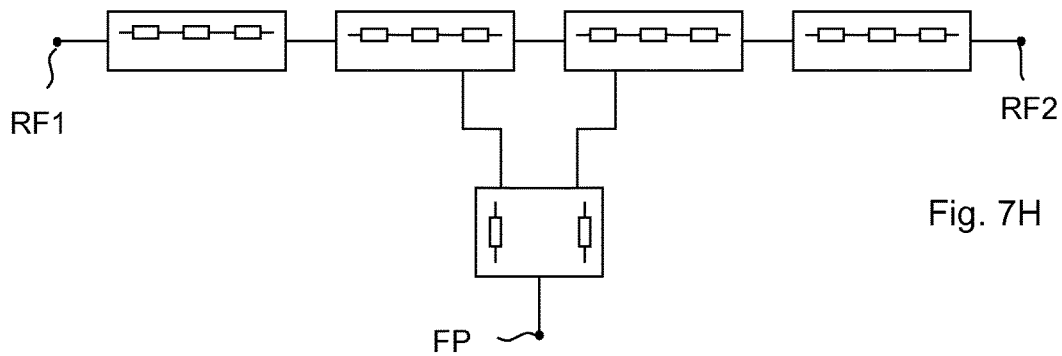
Figure 7I:
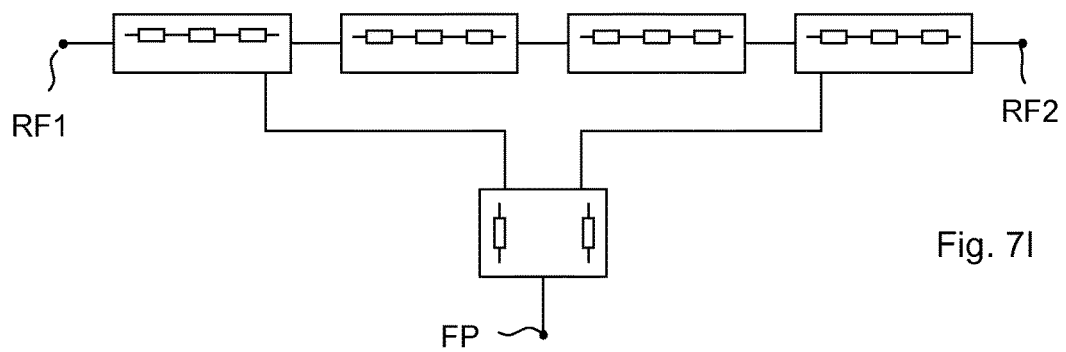
Figure 7J:
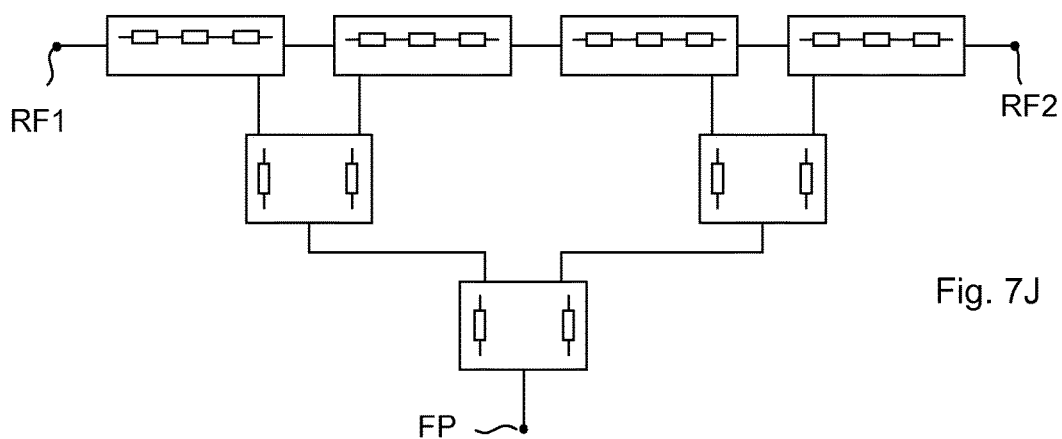
Figure 8:
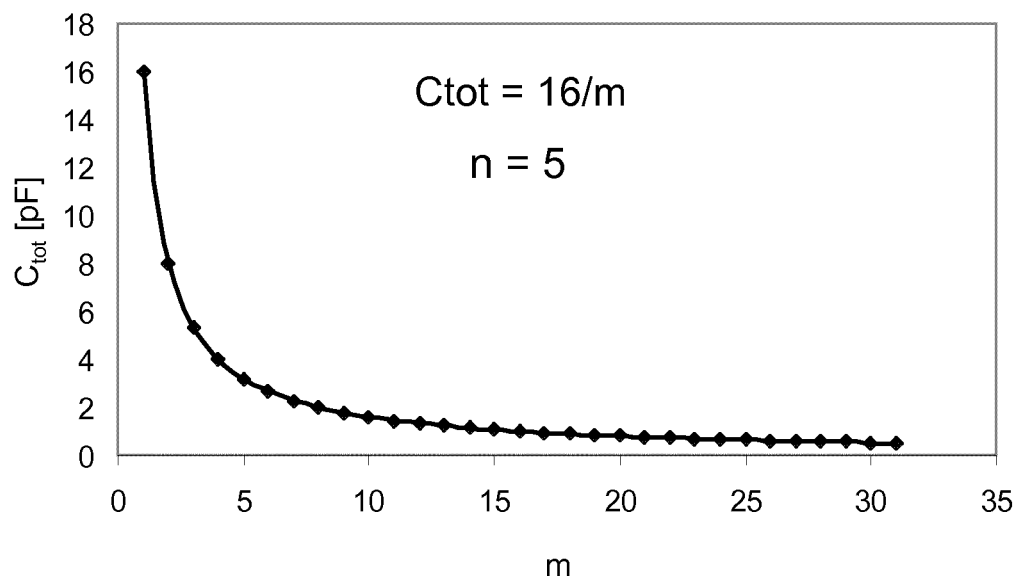
Figure 9:
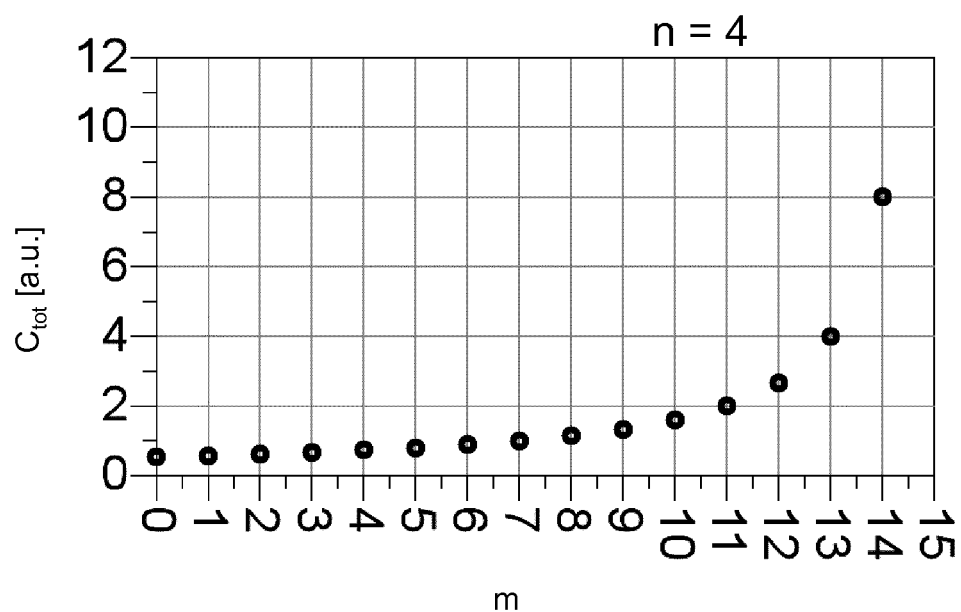
Figure 10:
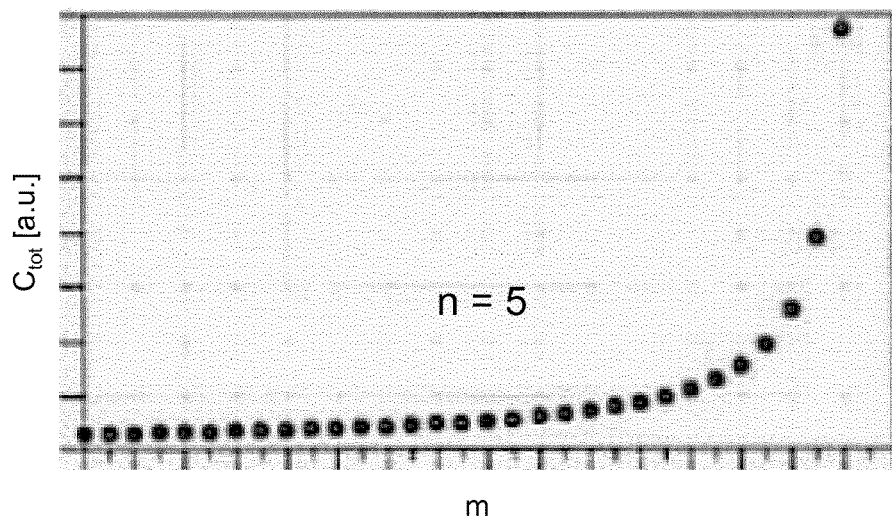
FIG. 10 shows possible total capacities where the capacitors have the capacitances 1.9375 pF, 3.875 pF, 7.75 pF, 15.5 pF, and 31 pF. Thus, a binary weighting is chosen.
Figure 11:
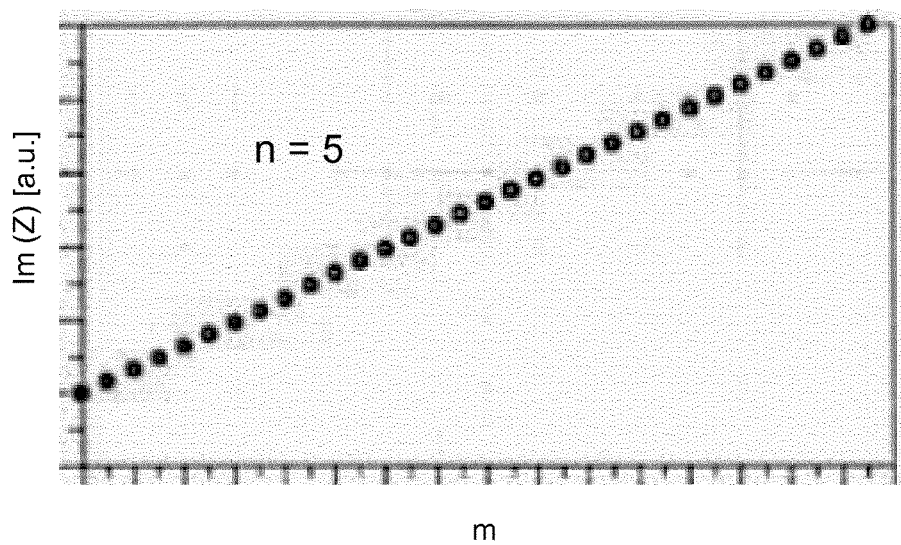
FIG. 11 shows the corresponding impedance values of the array of FIG. 10.
Figure 12:
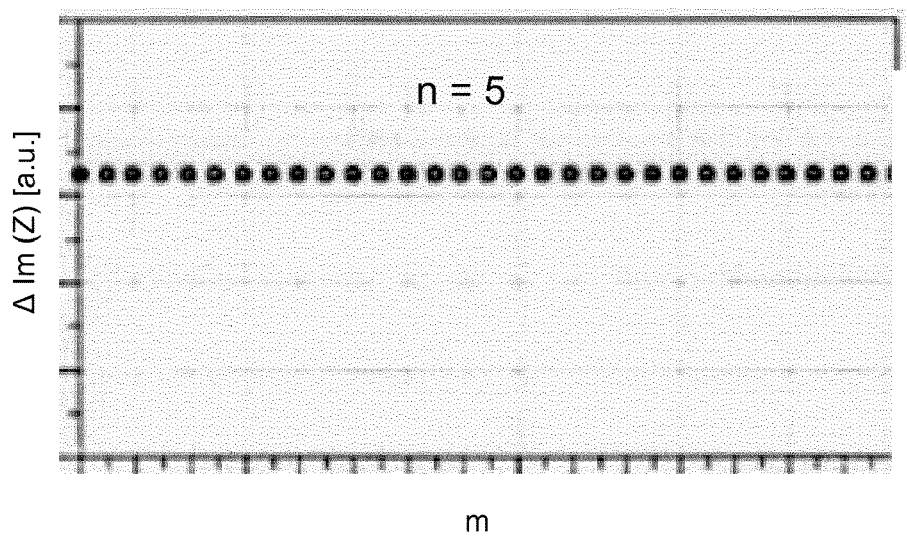
FIG. 12 shows the corresponding step size of the impedance values of the array of FIGS. 10 and 11.
Figure 13:
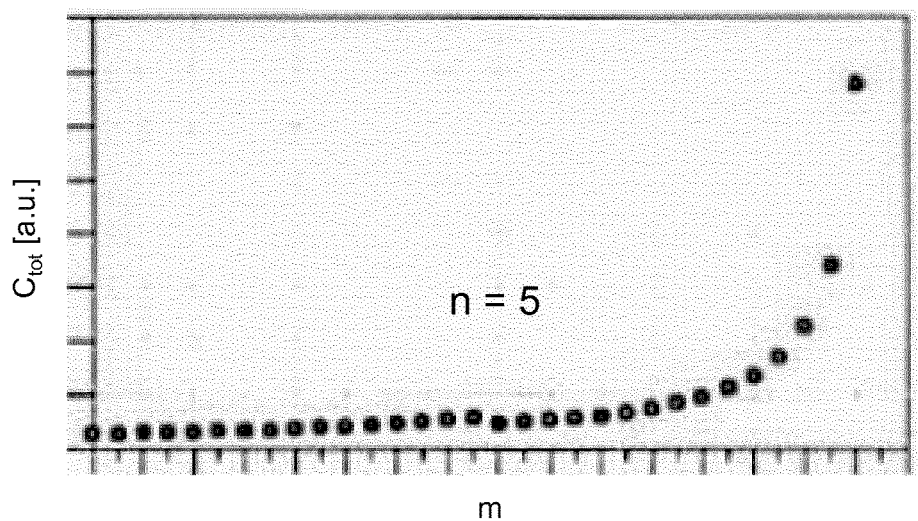

FIG. 13 shows the possible total capacitance values of a binary weighted array with an offset. Values of the capacitances are: 2.25 pF, 3.375 pF, 6.75 pF, 13.5 pF, and 27 pF. Thus, the scaling factor F is 0.75. Here, i=4. The resulting maximum voltages are 1.94:2.25=1.159 (i.e. 16%) lower than the maximum voltages of an array using F=1.

Figure 14:
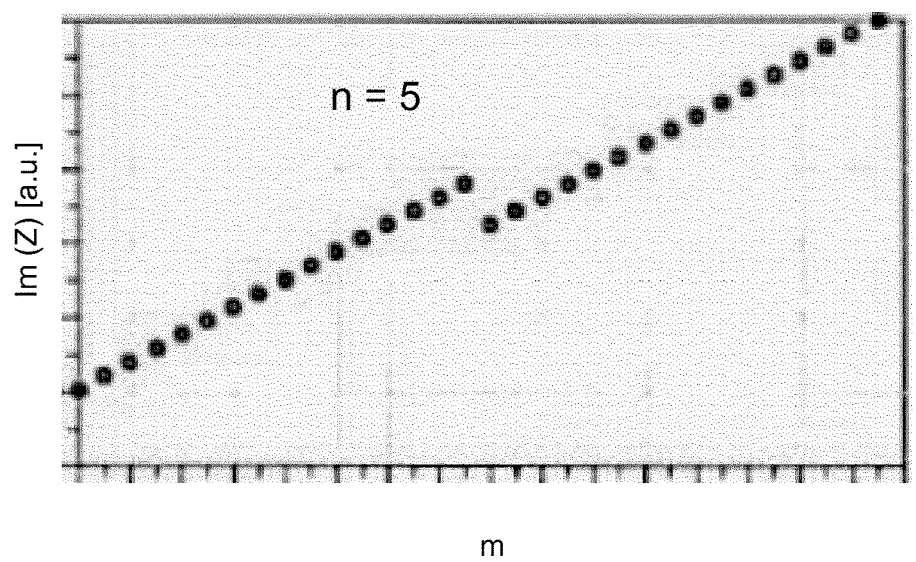

FIG. 14 shows the corresponding impedance values of the array of FIG. 13.

Figure 15:
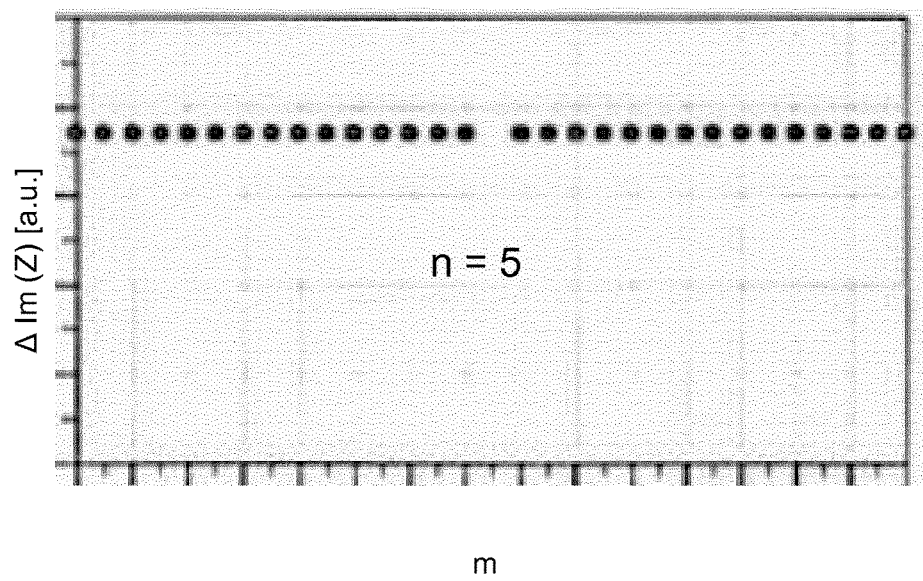

FIG. 15 shows the corresponding step size of the impedance values of the array of FIGS. 13 and 14.

Figure 16:
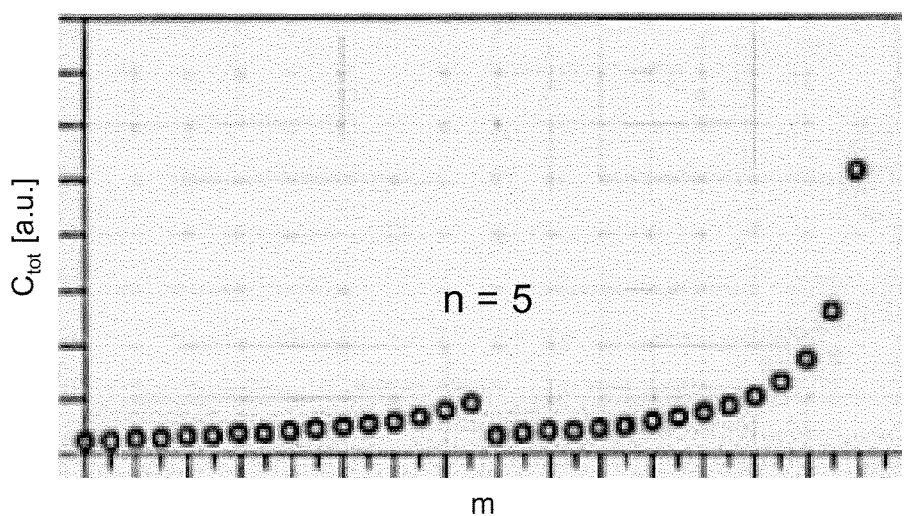

FIG. 16 shows the possible total capacitance values of an n=5 capacitor array with capacitance values: 3.641 pF, 7.585 pF, 5.17 pF, 10.34 pF, and 20.68 pF. Two sets of capacitance values corresponding to equally spaced impedance values are obtained which can be used for low power applications and high power applications or low band applications and high band applications. Especially the most significant bit or the smallest capacitor, respectively, can be used as a selection means for high power or low power operation, e.g. in the GSM (GSM=Global System for Mobile communication) system.

The scaling factor F equals 0.35.

Figure 17:
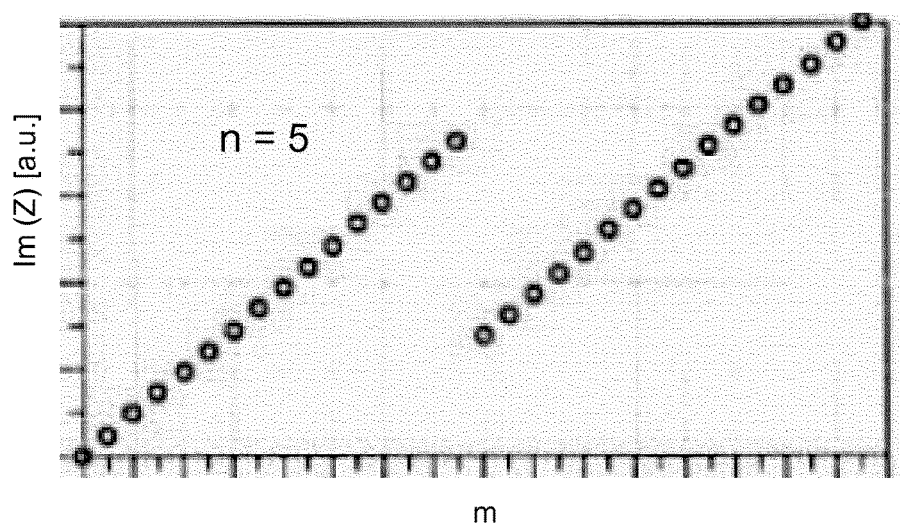

FIG. 17 shows the corresponding impedance values of the array of FIG. 16.

Figure 18:
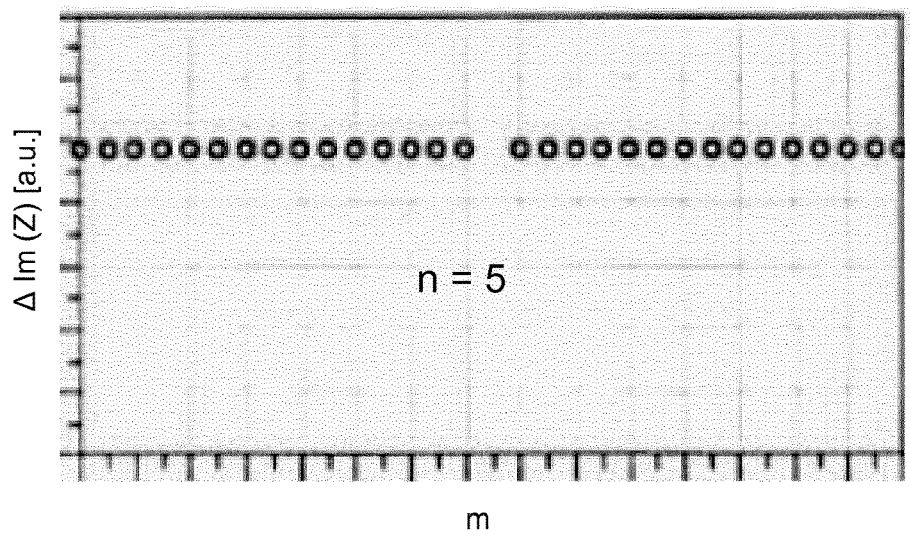

FIG. 18 shows the corresponding step size of the impedance values of the array of FIGS. 16 and 17.

Figure 19:
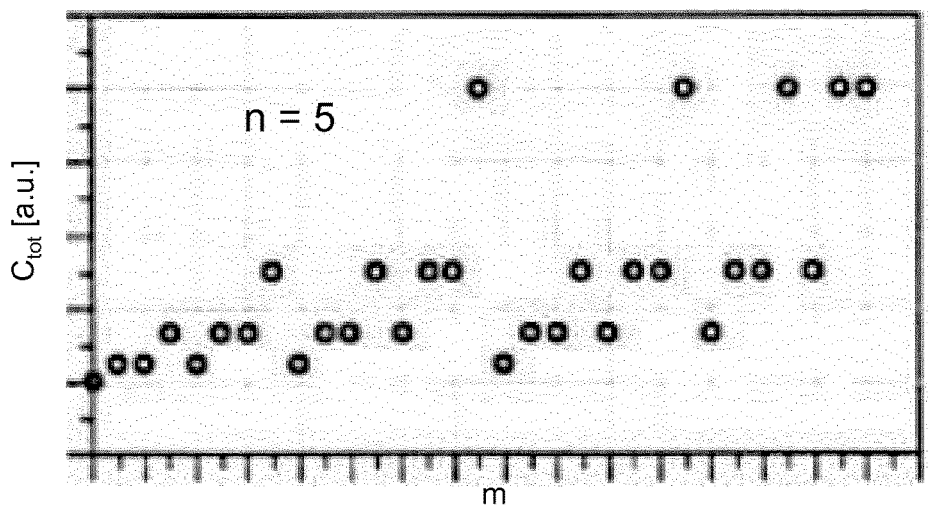

FIG. 19 shows possible total capacitances of a capacitor array in which the individual capacitances of the capacitor units are equal, i.e. 5 pF. With such a capacitor array, thermometer coding can be used and obtained redundancy in the array capacitance values can be counteracted by skipping redundant states implemented in an algorithm in a logic circuit. Then, redundant states utilizing redundant capacitors can be reactivated if the failure of one or several capacitors is detected.

However, redundant capacitors can be utilized in high-power applications, too.

Figure 20:
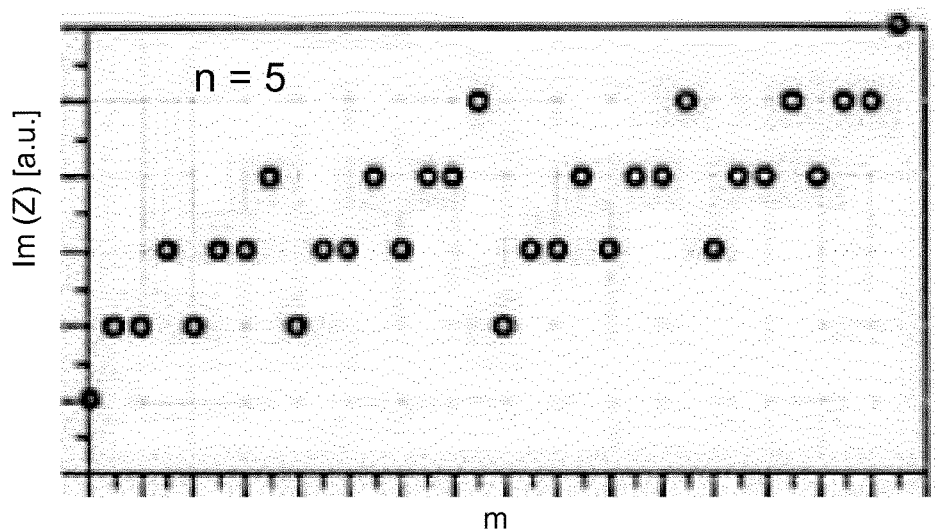

FIG. 20 shows the corresponding impedance values of the array of FIG. 19.

Figure 21:
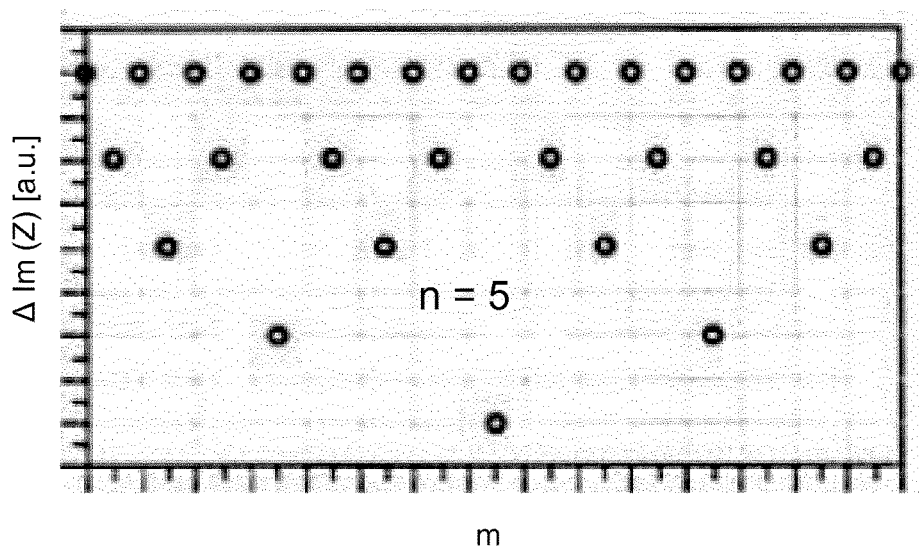

FIG. 21 shows the corresponding step size of the impedance values of the array of FIGS. 19 and 20.

Figure 22:
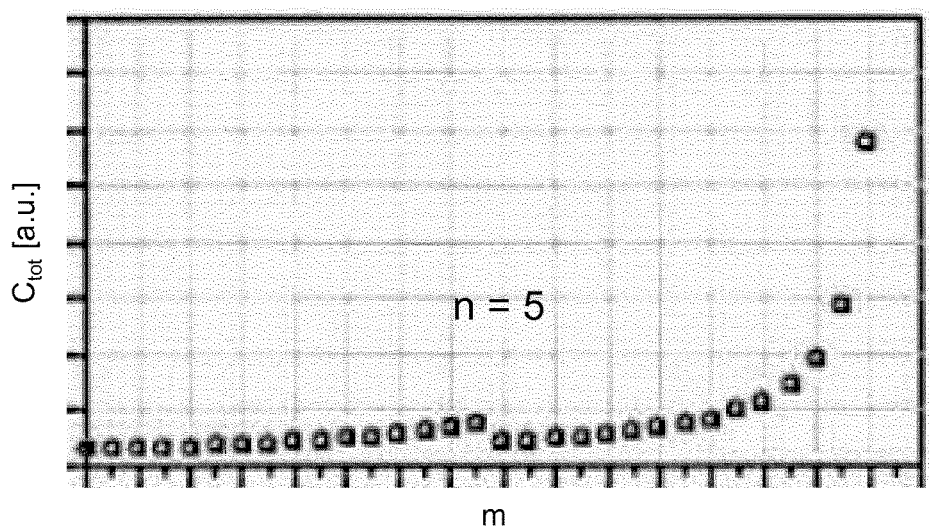

FIG. 22 shows the possible total capacitance values of an n=5 capacitor array with the capacitances: 2.875 pF, 2.875 pF, 5.75 pF, 11.5 pF, and 23 pF.

Figure 23:
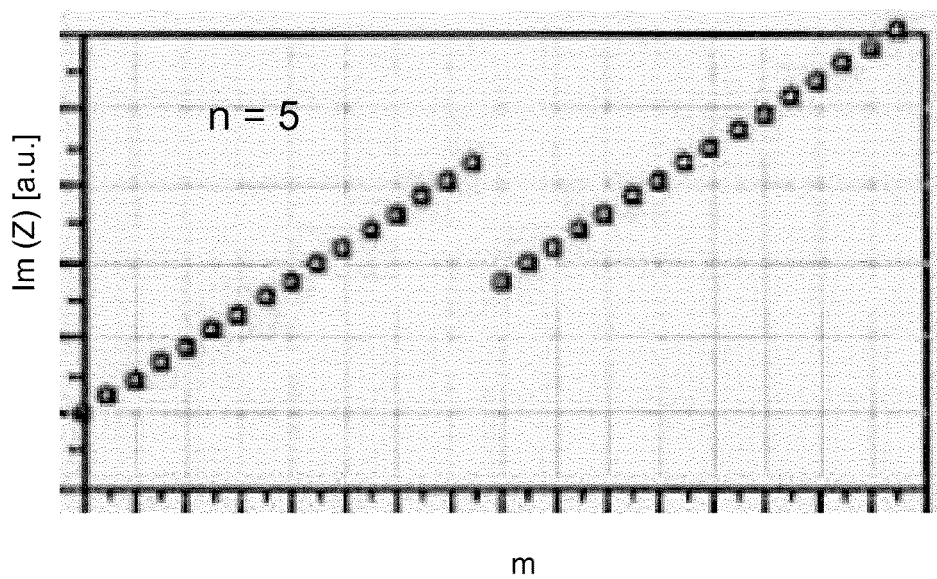

FIG. 23 shows the corresponding impedance values of the array of FIG. 22.

Figure 24:
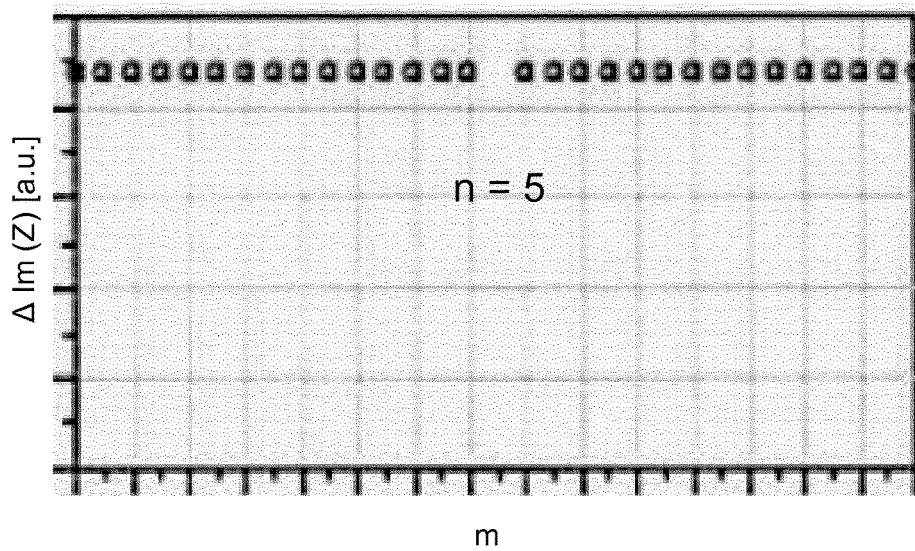

FIG. 24 shows the corresponding step size of the impedance values of the array of FIGS. 22 and 23.

Figure 25:
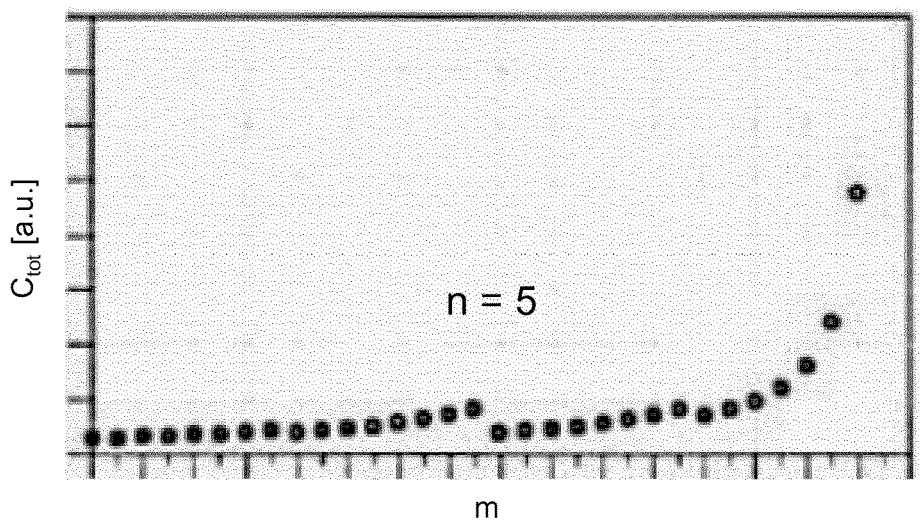

FIG. 25 shows total capacitance values of an n=5 capacitor array with the capacitances: 3.167 pF, 3.167 pF, 4.75 pF, 9.5 pF, and 19 pF.

Figure 26:
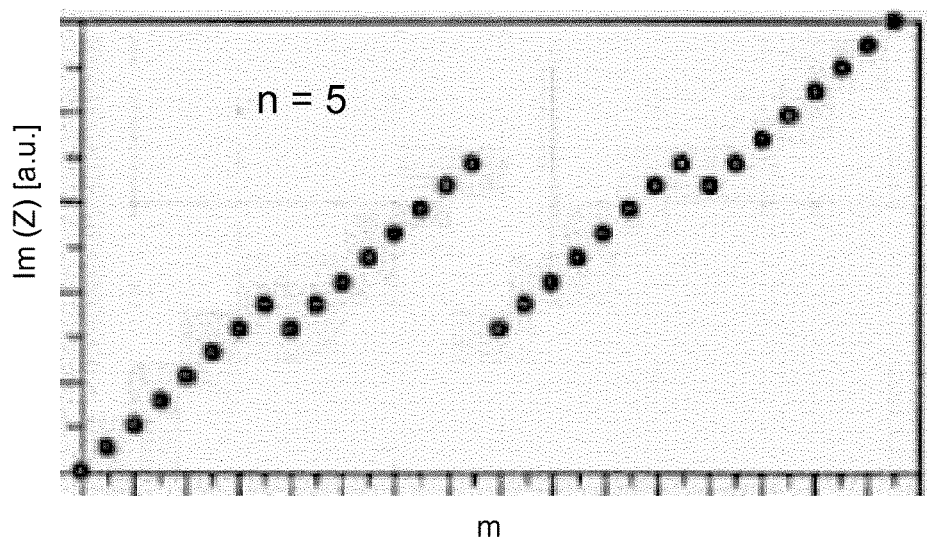

FIG. 26 shows the corresponding impedance values of the array of FIG. 25.

Figure 27:
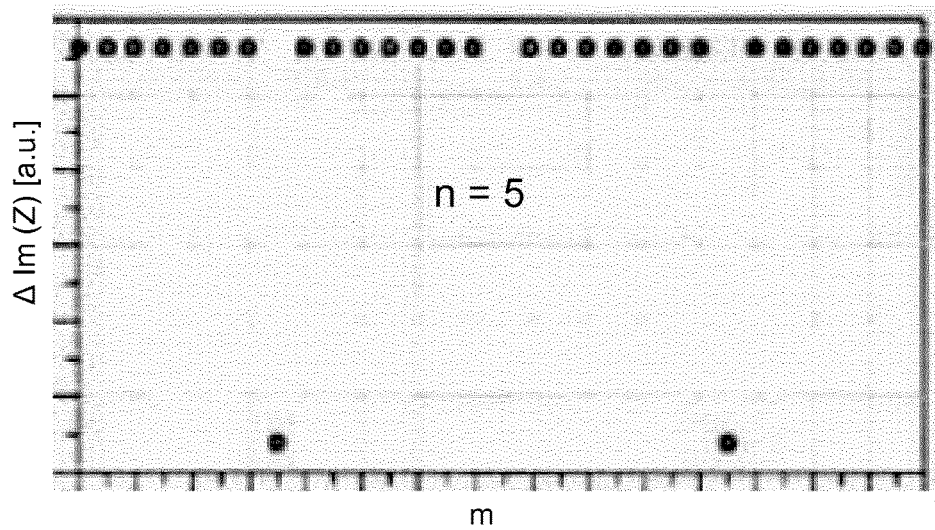

FIG. 27 shows the corresponding step size of the impedance values of the array of FIGS. 25 and 26.

Figure 28:
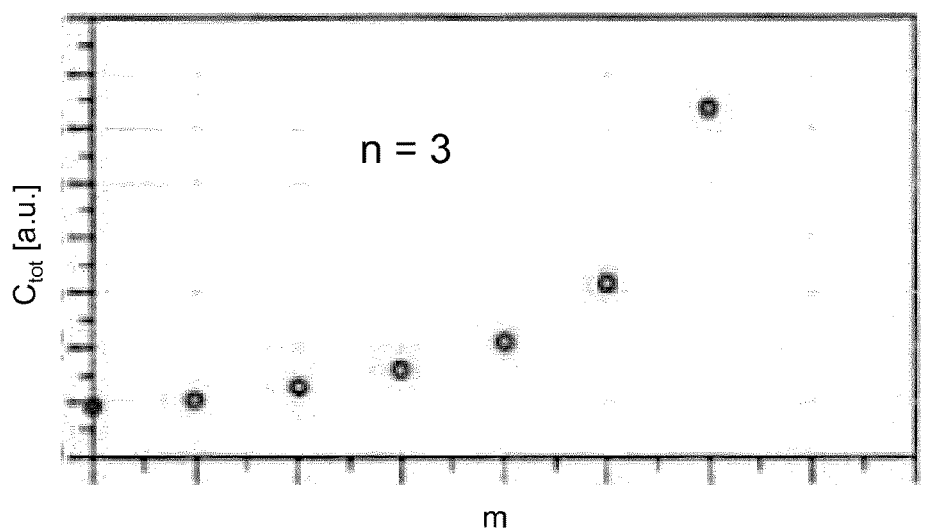

FIG. 28 shows total capacitance values of an n=3 (the lowest 7) capacitor array with binary weighting.

Figure 29:
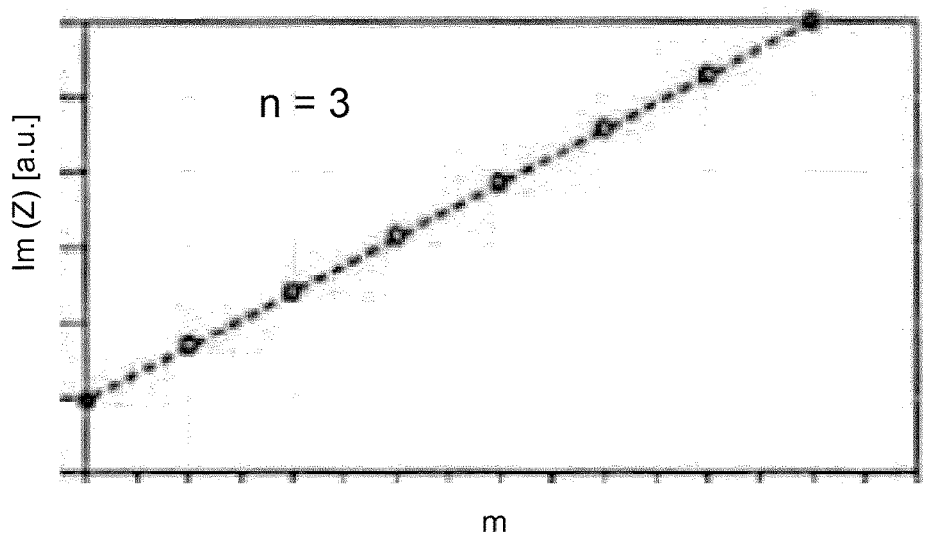

FIG. 29 shows the corresponding impedance values of the array of FIG. 28.

Figure 30:
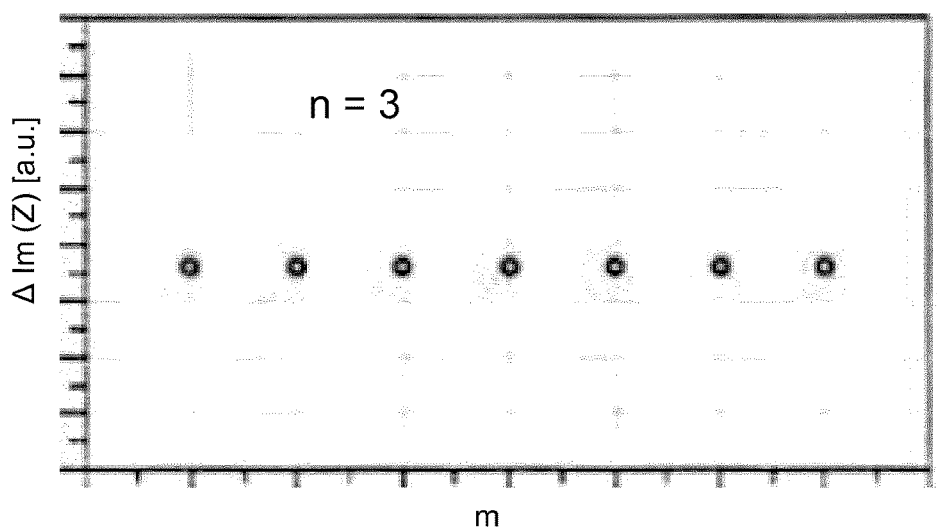

FIG. 30 shows the corresponding step size of the impedance values of the array of FIGS. 28 and 29.

Figure 31:
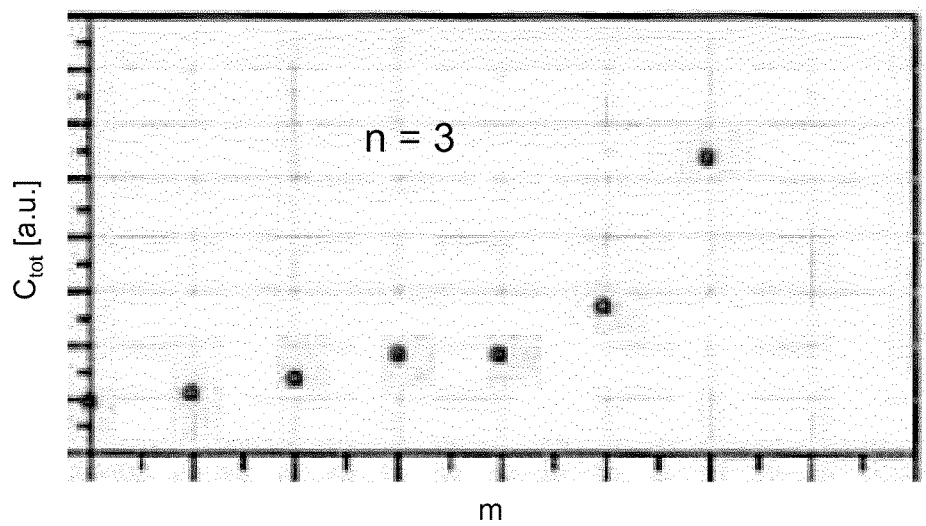

FIG. 31 shows possible total capacitance values. The fourth and the fifth capacitance values are equal, being the result from the fact that two capacitor units have the same capacitance.

Figure 32:
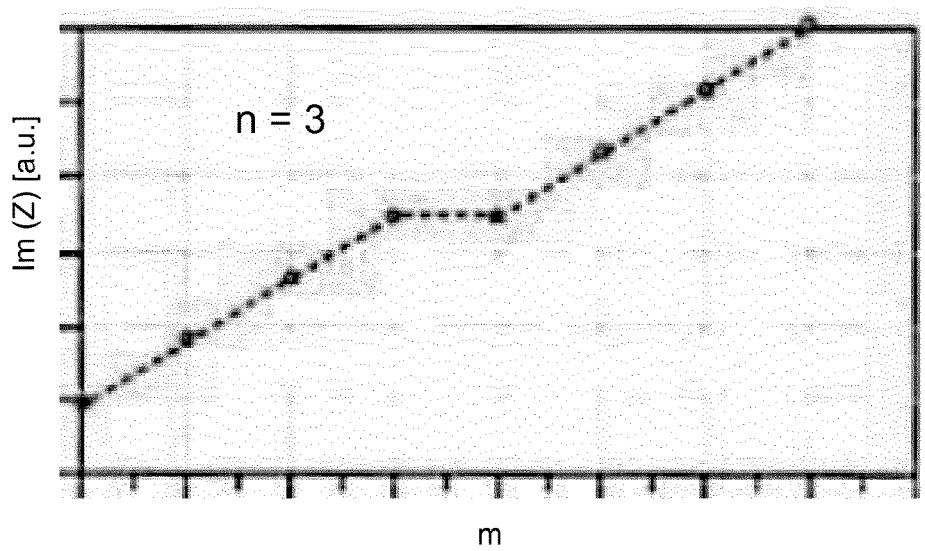

FIG. 32 shows the corresponding impedance values of the array of FIG. 31.

Figure 33:
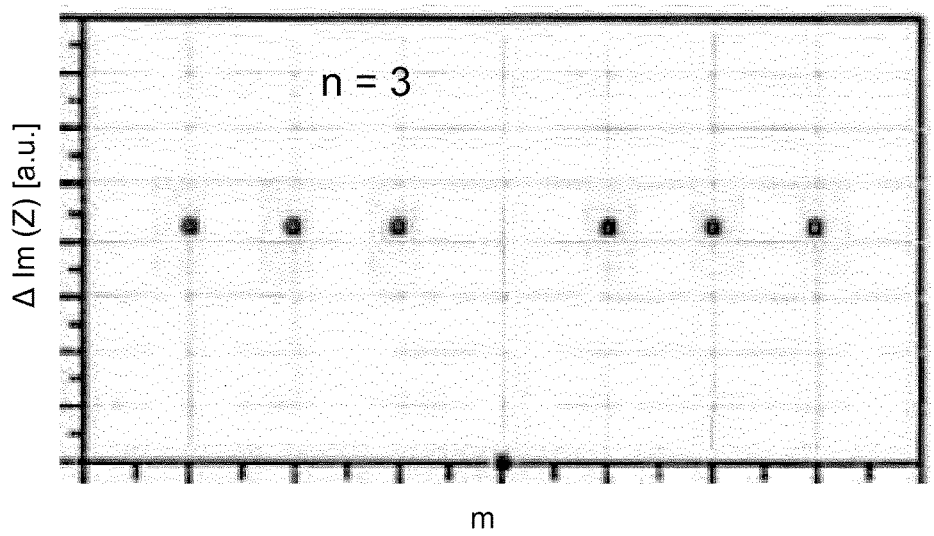

FIG. 33 shows the corresponding step size of the impedance values of the array of FIGS. 31 and 32.

LIST OF REFERENCE SIGNS

CAP: capacitor
CAP1, CAP2: first, second capacitor of a capacitor unit
$CAP_{add}$: additional capacitor
$C_{tot}$: total capacitance of the switchable capacitor array
CU: capacitor unit
FET: field-effect transistor
FP: feeding point
FPb: feeding point for a body bias voltage
FPg: feeding point for a gate control signal
i: index number of capacitor unit ($0 \leq i \leq n-1$)
m: index number of switching state ($0 \leq m \leq 2^n - 1$)
n: number of capacitor units in the switchable capacitor array
R: resistive element
RB: resistive element connected with the body of a FET
RF1: node connecting the switch unit to an RF signal path
RF2: node to connect the switch unit to an RF signal path
SCA: switchable capacitor array
SU: switch unit
SU1, SU2: first, second switch unit
SW: switch

The invention claimed is:

1. A switchable capacitor array comprising:
a plurality of n >=2 capacitors units, each comprising a capacitor with a capacitance $c_i$ and a switch unit, wherein
the capacitances $c_i$ have a binary weighting with an offset;
the capacitor units are electrically connected in series; and
the switch unit of each capacitor unit is electrically connected in parallel to the respective capacitor.

2. The array of claim 1, wherein the plurality of capacitor units providing $2^n$ switchable capacitance values, and at least one subset of the $2^n$ switchable capacitance values corresponding to equidistantly spaced reactance values.

3. The array of claim 1, wherein the switch units comprise stacks of switches.

4. The array of claim 1, wherein the switch units comprise switches selected from: FET-switches, CMOS switches, GaAs switches, pHEMT switches, SOI switches, SOS switches and MEMS switches.

5. The array of claim 1, wherein capacitors are MIM capacitors.

6. The array of claim 1, wherein at least two of the capacitor units having substantially similar structure.

7. The array of claim 1, further comprising an additional capacitor with a capacitance $c_{add}$ electrically connected in parallel to the series connection of capacitor units.

8. The array of claim 1, wherein a capacitor unit has a parallel connection of capacitors.

9. The array of claim 1, wherein the switch units comprise parallel or serial connected uniform unit cells.

10. The array of claim 1, wherein the switch units are arranged in a first layer system and the capacitors are arranged in a second layer system located above or below the first layer system.

11. The array of claim 1, being a tunable capacitor in an RF-Filter circuit.

12. The array of claim 11, wherein the tunable capacitor is connected in series in a signal path of the RF-filter.

13. The array of claim 1, wherein
one or all switch units have a bias configuration comprising serial and/or parallel biasing paths with resistive elements adapted to provide a high switch time, a high Q-factor or a preferred trade-off between switch time and Q-factor.

14. The array of claim 13, wherein the array is connected in a front end circuit of a mobile communication device.

15. A mobile communication device, comprising:
an impedance matching circuit with a signal path;
a plurality of n >=2 capacitors units, each comprising a capacitor with a capacitance $c_i$ and a switch unit, wherein the capacitor units are electrically connected in series, and the capacitances $c_i$ have a binary weighting with an offset; and
the switch unit of each capacitor unit is electrically connected in parallel to the respective capacitor.

16. A method for driving a switchable capacitor array, the switchable capacitor array comprising:
a plurality of n >=2 capacitors units, each comprising a capacitor with a capacitance $c_i$ and a switch unit, wherein the capacitor units are electrically connected in series, and the capacitances $c_i$ have a binary weighting with an offset; and
the switch unit of each capacitor unit is electrically connected in parallel to the respective capacitor, wherein the bits of a n bit word created with a logic circuit determines the switching state of the n capacitor units.

17. The method of claim 16, wherein the most significant bit corresponds to the largest capacitance value or to the smallest capacitance value.

18. The method of claim 16, wherein inverted bits are used to control the switching state of the capacitor units.

* * * * *